(12) United States Patent
Jen et al.

(10) Patent No.: US 10,775,413 B2
(45) Date of Patent: Sep. 15, 2020

(54) IMAGE SENSOR TESTING PROBE CARD

(71) Applicant: OmniVision Technologies, Inc., Santa Clara, CA (US)

(72) Inventors: Chih-Pin Jen, HsinChu (TW); Ming-Chang Yang, Hsinchu (TW); Sheng-Kuai Yang, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 576 days.

(21) Appl. No.: 15/285,731

(22) Filed: Oct. 5, 2016

(65) Prior Publication Data

US 2017/0023614 A1 Jan. 26, 2017

Related U.S. Application Data

(63) Continuation of application No. 13/787,472, filed on Mar. 6, 2013, now Pat. No. 9,494,617, which is a (Continued)

(51) Int. Cl.
*G01R 31/311* (2006.01)
*G01R 1/073* (2006.01)
*G01R 3/00* (2006.01)

(52) U.S. Cl.
CPC ..... *G01R 1/07364* (2013.01); *G01R 1/07378* (2013.01); *G01R 31/311* (2013.01); (Continued)

(58) Field of Classification Search
CPC ............ G01R 1/07378; G01R 1/07364; G01R 31/311; G01R 1/07342; G01R 3/00; Y10T 29/49165
(Continued)

(56) References Cited

U.S. PATENT DOCUMENTS

| 5,298,939 A | 3/1994 | Swanson et al. |
| 6,513,962 B1 | 2/2003 | Mayshack et al. |
| (Continued) | | |

FOREIGN PATENT DOCUMENTS

| CN | 101611324 | 12/2009 |
| CN | 101923103 | 12/2010 |
| (Continued) | | |

OTHER PUBLICATIONS

Translation of office action corresponding to Chinese Patent Application No. 201410080747.2, dated May 3, 2016, 8 pages.
(Continued)

*Primary Examiner* — Melissa J Koval
*Assistant Examiner* — Courtney G McDonnough
(74) *Attorney, Agent, or Firm* — Lathrop GPM LLP

(57) ABSTRACT

A method of increasing uniformity in light from a light source at a plurality of targets of the light includes locating a plurality of movable aperture elements between the light source and the targets. Each aperture element defines an aperture through which the light passes from the light source to an associated one of the plurality of targets associated with the aperture element along a longitudinal axis of the aperture element. The method also includes moving at least one of the aperture elements along its longitudinal axis to change a feature of light incident on the target associated with the aperture element.

10 Claims, 24 Drawing Sheets

Related U.S. Application Data continuation-in-part of application No. 13/671,335, filed on Nov. 7, 2012, now Pat. No. 9,239,147.

(52) U.S. Cl.
CPC ............ *G01R 1/07342* (2013.01); *G01R 3/00* (2013.01); *Y10T 29/49165* (2015.01)

(58) Field of Classification Search
USPC .................................................. 324/750.14
See application file for complete search history.

(56) References Cited

U.S. PATENT DOCUMENTS

| | | | |
|---|---|---|---|
| 6,830,184 B2 | 12/2004 | Tsikos et al. | |
| 6,866,401 B2 | 3/2005 | Sommers et al. | |
| 7,331,681 B2 | 2/2008 | Pohlert et al. | |
| 8,596,542 B2 | 12/2013 | Havens et al. | |
| 2002/0071601 A1* | 6/2002 | Kawada ............ | H05K 13/0812 382/145 |
| 2003/0117797 A1 | 6/2003 | Sommers et al. | |
| 2004/0031779 A1 | 2/2004 | Cahill et al. | |
| 2007/0268483 A1* | 11/2007 | Yatsugake ............ | G01N 21/84 356/237.1 |
| 2008/0149853 A1* | 6/2008 | Hebert ................. | H04N 17/002 250/492.1 |
| 2008/0218186 A1* | 9/2008 | Kooiman ............ | G01R 31/311 324/754.07 |
| 2009/0002001 A1 | 1/2009 | Caldwell et al. | |
| 2010/0014807 A1* | 1/2010 | Shin ..................... | G02B 6/2848 385/27 |
| 2010/0176831 A1 | 7/2010 | Palcisko et al. | |
| 2013/0249584 A1 | 9/2013 | Lou et al. | |
| 2013/0285690 A1 | 10/2013 | Andberg | |

FOREIGN PATENT DOCUMENTS

| | | |
|---|---|---|
| EP | 0226995 | 7/1987 |
| TW | M356906 | 5/2009 |
| WO | 2004034068 | 4/2004 |
| WO | 2009048618 | 5/2009 |

OTHER PUBLICATIONS

Chinese Application 201310521466.1 Office Action dated Dec. 21, 2015, 12 pages.

U.S. Appl. 13/671,335 Notice of Allowance dated Oct. 21, 2015, 11 pages.

U.S. Appl. No. 13/671,335 Office Action dated Apr. 7, 2015, 19 pages.

Taiwanese Patent Application 102136842 Office Action received Dec. 2014,9 pages.

Taiwanese Patent Application 103106858 Office Action dated Dec. 30, 2014, 9 page.

U.S. Appl. No. 13/787,472 Office action dated Jul. 10, 2015, 21 pages.

Huang, et al., Taiwanese Application 356905, "Probe Testing Device for Testing !mag-Sensing Chip," English Machine Translation, May 11, 2009.

Translation of office action corresponding to Chinese Patent Application No. 201410080747.2, dated Dec. 29, 2016, 13 pages.

Translation of second Office Action corresponding to Chinese Patent Application No. 201410080747.2, dated Dec. 29, 2016, 13 pages.

Translation of third Office Action corresponding to Chinese Patent Application No. 201410080747.2, dated May 24, 2017, 7 pages.

\* cited by examiner

|  | Without "Ring" tooling | | | | With "Ring" tooling | | | |
| --- | --- | --- | --- | --- | --- | --- | --- | --- |
| SITE | MeanR | MeanG1 | MeanG2 | MeanB | MeanR | MeanG1 | MeanG2 | MeanB |
| 1 | 82.19 | 136.62 | 137.17 | 117.63 | 82.07 | 135.29 | 135.34 | 114.49 |
| 2 | 83.42 | 136.31 | 136.61 | 116.87 | 82.84 | 134.54 | 134.58 | 113.69 |
| 3 | 83.80 | 135.87 | 136.15 | 114.81 | 84.51 | 135.44 | 135.97 | 113.28 |
| 4 | 87.13 | 143.28 | 143.56 | 121.42 | 82.55 | 134.32 | 134.34 | 112.61 |
| 5 | 84.06 | 136.13 | 136.40 | 115.47 | 83.75 | 134.84 | 135.11 | 112.96 |
| 6 | 76.48 | 124.85 | 125.35 | 106.30 | 82.91 | 134.36 | 134.63 | 113.26 |
| 7 | 83.46 | 138.10 | 138.64 | 117.67 | 82.54 | 135.62 | 135.64 | 113.95 |
| 8 | 87.07 | 140.74 | 141.03 | 119.70 | 83.89 | 134.36 | 134.87 | 113.03 |
| 9 | 81.16 | 131.63 | 131.89 | 111.55 | 84.05 | 135.16 | 135.43 | 113.18 |
| 10 | 77.95 | 127.38 | 127.65 | 108.79 | 82.79 | 134.59 | 134.86 | 113.69 |
| 11 | 77.20 | 128.53 | 128.56 | 109.93 | 82.24 | 135.68 | 135.97 | 114.46 |
| 12 | 83.98 | 137.85 | 138.41 | 118.32 | 83.54 | 135.66 | 135.96 | 114.73 |
| 13 | 70.38 | 117.02 | 117.28 | 101.05 | 82.04 | 135.17 | 135.47 | 115.55 |
| 14 | 83.67 | 137.51 | 137.54 | 117.76 | 82.90 | 134.55 | 134.83 | 113.84 |
| 15 | 83.18 | 136.67 | 136.97 | 117.77 | 83.42 | 135.57 | 135.86 | 115.21 |
| 16 | 86.58 | 141.58 | 141.89 | 121.27 | 83.70 | 135.60 | 135.89 | 114.16 |
| Max | 87.13 | 143.28 | 143.56 | 121.42 | 84.51 | 135.68 | 135.97 | 115.55 |
| Min | 70.38 | 117.02 | 117.28 | 101.05 | 82.04 | 134.32 | 134.34 | 112.61 |
| Max-Min | 16.76 | 26.26 | 26.28 | 20.37 | 2.46 | 1.36 | 1.64 | 2.95 |
| Average | 81.98 | 134.38 | 134.69 | 114.77 | 83.11 | 135.05 | 135.30 | 113.88 |
| Deviation ratio | 10.22% | 9.77% | 9.76% | 8.87% | 1.48% | 0.50% | 0.60% | 1.29% |

FIG. 10

IMAGE SENSOR TESTING PROBE CARD

CROSS-REFERENCE TO RELATED APPLICATIONS

This application is a continuation of U.S. patent application Ser. No. 13/787,472 filed Mar. 6, 2013, which is a continuation-in-part of U.S. application Ser. No. 13/671,335 (now U.S. Pat. No. 9,239,147), filed Nov. 7, 2012. The entire content of the aforementioned applications is incorporated herein by reference.

BACKGROUND

1. Technical Field

This disclosure relates to manufacturing and testing of integrated image sensors formed on wafers and, more particularly, to a probe card used in testing of integrated image sensors formed on wafers.

2. Discussion of Related Art

In the manufacture of image sensors, a large number of image sensing elements can be formed on a single wafer. Multiple image sensing elements formed on a wafer can be tested simultaneously at the wafer level. After fabrication and testing are complete, the image sensing elements are separated such that each sensing element is formed on its own into individual chip die.

When testing at the wafer level, it is common to illuminate each image sensing element and test its performance by detecting an electrical signal generated by and output from the sensing element in response to the illumination. To that end, the testing apparatus typically includes a probe card located between the source of illumination, i.e., light source, and the wafer. For each sensing element being tested at one time, the probe card includes an opening or aperture, which permits light from the light source to reach the wafer. The probe card also includes at least one conductive probe pin which makes contact with the image sensing element to detect the electrical signal generated and output by the sensing element in response to the illumination.

To reduce testing time and cost, it is common to test multiple image sensing elements on a wafer simultaneously. To accommodate simultaneous testing of multiple image sensing elements, the probe card includes multiple apertures, one for each image sensing element being tested, and multiple probe pins, at least one for each image sensing element being tested. The light source that provides the illumination provides the light required to illuminate all of the image sensing elements through all of the respective apertures simultaneously. One drawback to this approach is that, in general, the light source is not perfectly uniform. As a result, the image sensing elements are not all illuminated with light of the same intensity. This results in errors being introduced into the testing of the image sensing elements.

It has been determined that the nonuniformity of the illumination from the light source varies according to distance between the light source and the wafer. That is, as the distance between the light source and the wafer increases, the nonuniformity of the illumination provided by the light source also increases. Accordingly, it would be desirable to maintain the distance between the light source and the wafer as small as possible. However, in the typical testing environment, various system components such as a light diffuser, one or more lenses, the probe card, and/or probe pins are disposed between the light source and the wafer. Sufficient distance must be provided to accommodate these components. Since the distance between the light source and the wafer is constrained by this space limitation, the uniformity of the illumination at the multiple image sensing elements in conventional systems is limited.

The thickness of the probe card affects the distance between the light source and the wafer. A relatively thick probe card would result in increased distance and nonuniformity of the illumination. A relatively thin probe card would result in decreased distance and nonuniformity. Therefore, it is desirable that the probe card be as thin as possible.

SUMMARY

According to one aspect, an apparatus for increasing uniformity in light from a light source at a plurality of targets of the light is provided. The apparatus includes a plurality of movable aperture elements, locatable between the light source and the targets, each aperture element defining an aperture through which the light passes from the light source to an associated one of the plurality of targets associated with the aperture element along a longitudinal axis of the aperture element. A holder movably holds the plurality of aperture elements, each of the plurality of aperture elements being movable within the holder along the longitudinal axis of the aperture element to change a feature of light incident on the target associated with the aperture element.

According to another aspect, a method of increasing uniformity in light from a light source at a plurality of targets of the light is provided. The method includes locating a plurality of movable aperture elements between the light source and the targets, each aperture element defining an aperture through which the light passes from the light source to an associated one of the plurality of targets associated with the aperture element along a longitudinal axis of the aperture element. At least one of the aperture elements is moved along its longitudinal axis to change a feature of light incident on the target associated with the aperture element.

According to another aspect, a probe card for use in testing a wafer includes a printed circuit board (PCB) having a conductor pattern and a probe head in proximity to the PCB, the probe head defining at least one hole through the probe head, and the probe head being made of an electrically insulating material. At least one conductive pogo pin is disposed respectively in the at least one hole, the pogo pin having a first end electrically connected to the conductor pattern on the PCB. At least one conductive probe pin comprises a cantilever portion and a tip portion, the cantilever portion being in contact with and electrically connected to a second end of the pogo pin, and the tip portion being electrically connectable to the wafer to electrically connect the wafer to the conductor pattern on the PCB. The cantilever portion of the probe pin is fixedly attached to the probe head.

According to another aspect, a method of making a probe card for use in testing a wafer includes forming a probe head of an electrically insulating material, forming at least one hole through the probe head, locating at least one conductive pogo pin in the at least one hole, respectively, and attaching the probe head to a spacer for mechanically reinforcing the probe head.

BRIEF DESCRIPTION OF THE DRAWINGS

The foregoing and other features and advantages will be apparent from the more particular description of preferred embodiments, as illustrated in the accompanying drawings, in which like reference characters refer to the same parts throughout the different views. The drawings are not necessarily to scale, emphasis instead being placed upon illustrating the principles of the preferred embodiments. In the drawings, the sizes and thicknesses of layers, regions and features may be exaggerated for clarity.

FIG. 1B illustrates one probe card unit in detail.

FIG. 10 includes a table which tabulates illumination test data for a plurality of test sites comparing a test system configuration in which the ring control member of the present disclosure is not used to provide uniform illumination at the plurality of test sites with a test system configuration in which the ring control member according to the present disclosure is used to provide uniform illumination at the plurality of test sites.

DETAILED DESCRIPTION OF PREFERRED EMBODIMENTS

Figure 1A:
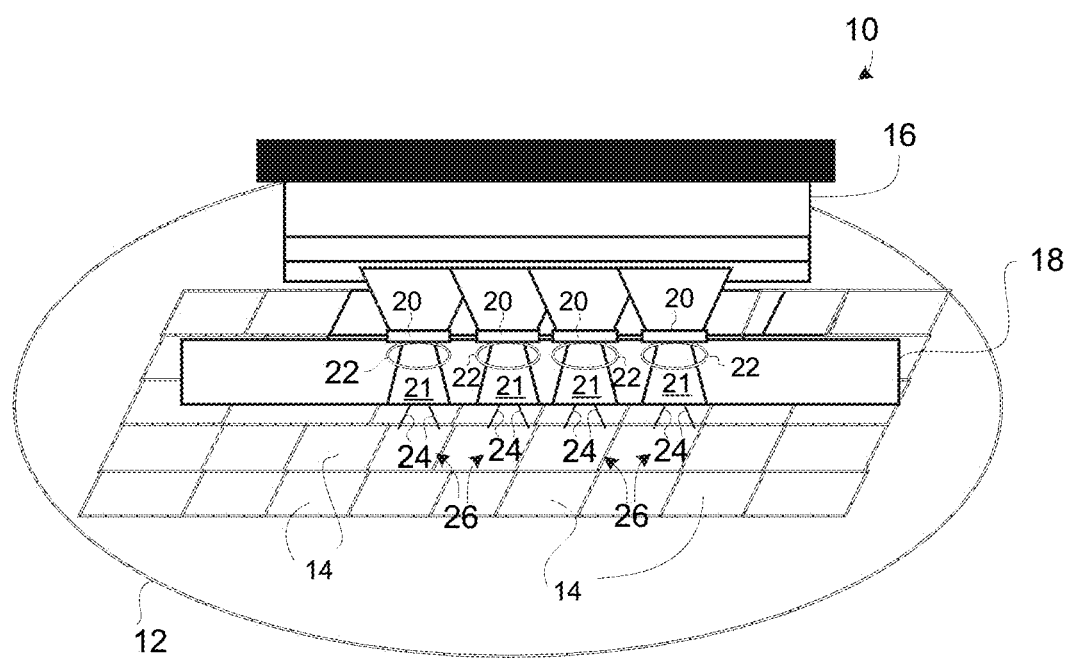
FIG. 1A includes a schematic perspective view of a conventional system used to test a wafer on which a plurality of image sensors is formed.

FIG. 1A includes a schematic perspective view of a conventional system used to test a wafer on which a plurality of image sensors are formed. Referring to FIG. 1A, the wafer 12 includes a plurality of image sensors 14 to be tested. After the testing, wafer 12 will be separated into a plurality of individual chip dies, each of which can include one of the image sensors 14. During the testing carried out by system 10, each of sensors 14 is illuminated with radiation, i.e., light, and the response of the sensor 14 to the illumination is monitored, such as by detecting one or more electrical signals generated by image sensor 14 in response to the illumination.

The test illumination is provided by a light source or illumination source 16. A probe card 18 for simultaneous multi-site testing is positioned between light source 16 and wafer 12. Probe card 18 includes a plurality of probe card units 21 corresponding to a respective plurality of image sensor test sites 26 on wafer 12. The plurality of probe card units 21 includes a respective plurality of diffusers 20 for diffusing the light from light source 16 and a respective plurality of lenses 22 for focusing the diffused light from the diffusers 20 onto respective image sensor test sites 26 on wafer 12. Generally, each of the plurality of image sensor test sites 26 coincides with an image sensor 14 being tested by system 10. The probe card units 21 of probe card 18 also include a respective plurality of probe pin sets 24, each of which is configured to make electrical contact with a respective one of image sensors 14 being tested to detect the electrical response of its respective associated image sensor 14 to the test illumination. Each of probe pin sets 24 can include one or more pogo pins and/or probe pins for contacting its respective associated image sensor 14.

Figure 1B:
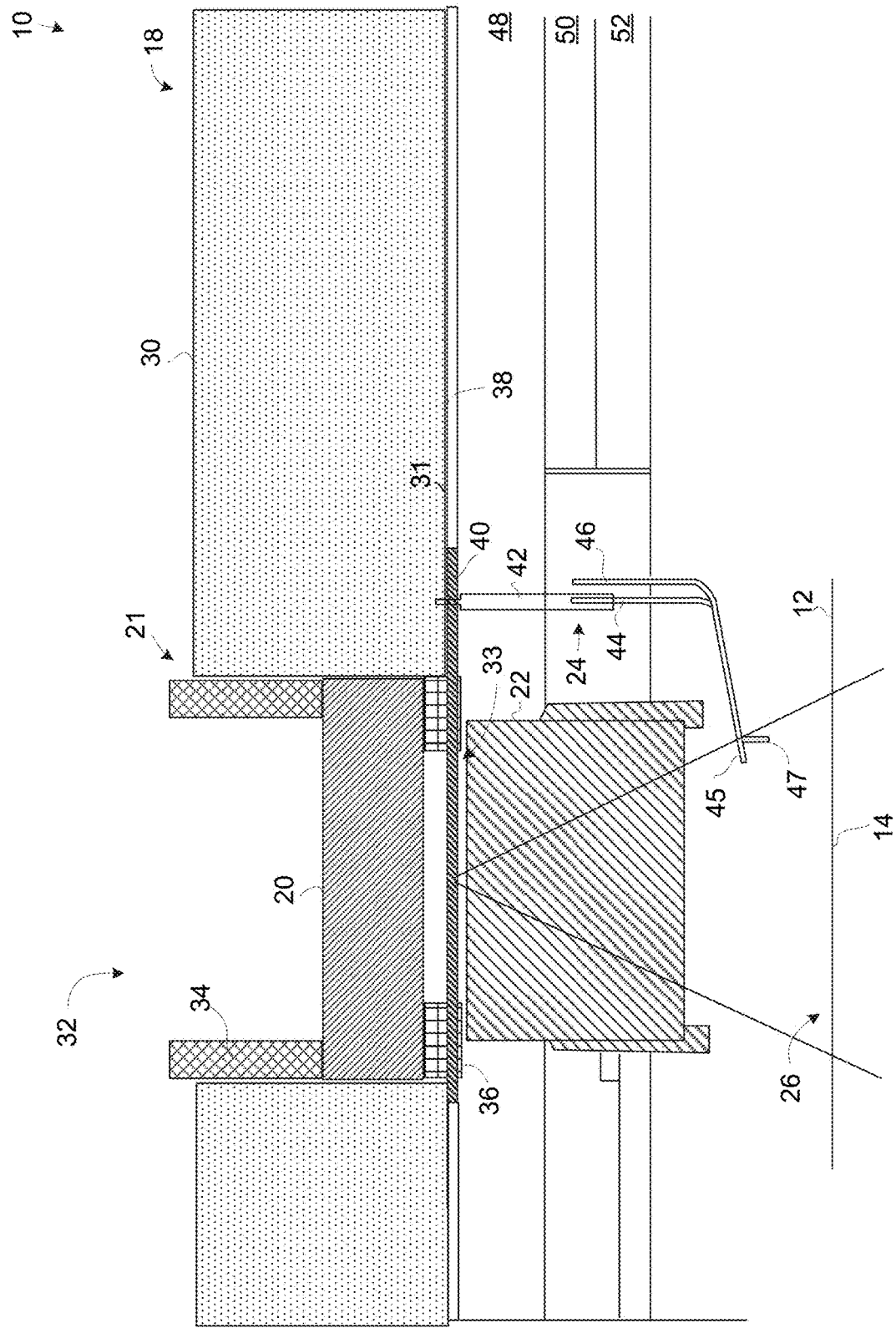
FIG. 1B includes a detailed schematic cross-sectional view of a portion of the probe card illustrated in FIG. 1A. Specifically.

FIG. 1B includes a detailed schematic cross-sectional view of a portion of the probe card 18 illustrated in FIG. 1A. Specifically, FIG. 1B illustrates one probe card unit 21 in detail. Light source 16 (not shown) is positioned above probe card 18. Referring to FIG. 1B, probe card 18 includes a printed circuit board (PCB) layer 30 in which an opening 32 for probe card unit 21 is defined. Diffuser 20 is supported and held within opening 32 by a ceramic tube 34, which holds diffuser 20 against O-ring 36 disposed beneath diffuser 20. A bottom surface 31 of PCB layer 30 can include a conductor pattern 38 printed thereon. Conductor pattern 38 can be covered with a protective insulating layer 40. A spacer 48 can be disposed beneath PCB layer 30. Diffuser 20 can be optically sealed to a top surface of spacer 48 via O-ring 36.

Spacer 48 can be mounted to a rigid structure which provides strength to probe card 18. Specifically, the rigid structure can include an upper die 50 mounted over a lower die 52, both of which can be made of a rigid material such as stainless steel, or other such material. Spacer 48 can be mounted to the top surface of upper die 50.

Illumination light used in testing image sensors 14 passes through diffuser 20 and then through opening 33 and lens 22. Lens 22 is mounted within spacer 48, as shown in FIG. 1B. Light from lens 22 reaches image sensor test site 26 associated with probe card unit 21 of probe card 18. During testing, one of image sensors 14 formed in wafer 12 is located at image sensor site 26 and is illuminated by testing illumination from lens 22.

As noted above, during testing, the response of image sensor 14 is monitored by detecting one or more electrical signals generated by image sensor 14 in response to the testing illumination. To that end, one or more probe pin assemblies or sets 24, each including one or more pogo pins 42, are connected to conductor pattern 38 on PCB layer 30. In probe pin assemblies 24, pogo pins 42 are conductively connected to one or more probe pins 44, 46 having conductive ends 45, 47, which make electrically conductive contact with image sensor 14. The electrical signal(s) generated by image sensor 14 in response to the illumination is(are) conducted via probe pins 44, 46 and pogo pins 42 to conductor pattern 38, which can be monitored such that the electrical signals from image sensor 14 can be used to evaluate performance of image sensor 14.

As noted above, multiple image sensors 14 are tested simultaneously. To that end, probe card 18 includes multiple probe card units 21 associated with multiple image sensor sites 26. In one particular probe card configuration, sixteen (16) dies in a 4×4 matrix configuration can be tested simultaneously, with neighboring probe card units 21 being spaced apart over the distance of several dies.

As noted above, it is important to the testing that the test illumination from light source 16 be uniform, since, for accurate evaluation of image sensors, each image sensor 14 must receive light of the same intensity. This uniformity has been difficult to achieve due to the distance that must be maintained between light source 16 and wafer 12. To make multi-site testing possible, ample space must be maintained between light source 16 and wafer 12 to accommodate components of the system, such as the diffuser, lens, pogo pins, etc. In some systems, a good working distance has been determined to be approximately 25 mm. However, the greater the distance between light source 16 and wafer 12, the less uniform the light illuminance will be.

Illuminance (units: lux) at a surface is the total light flux incident on the surface per unit area. It is a measure of the extent to which a light source illuminates the surface. The greater the distance between the light source and the illuminated surface, the more uneven the illuminance is over the surface. This relationship between separation distance of light source and wafer and illuminance uniformity is illustrated in FIGS. 2 through 4 and the following detailed description.

Figure 2:
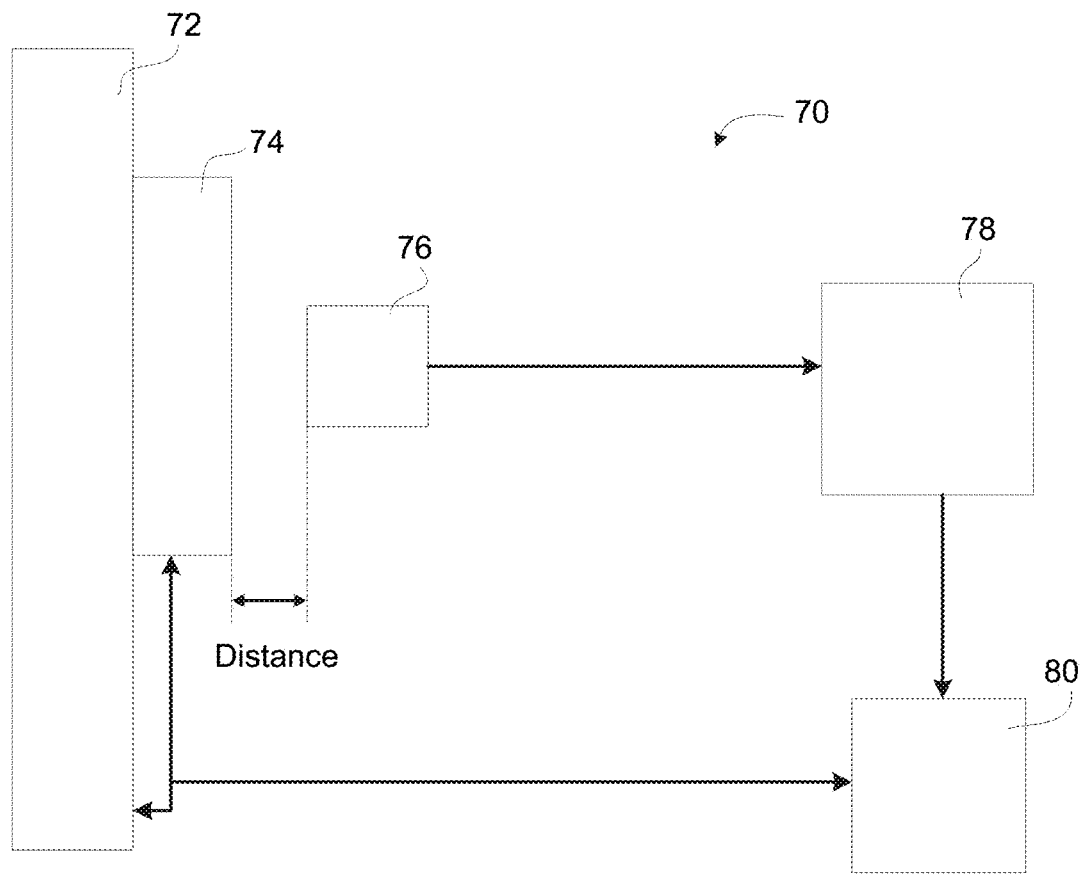
FIG. 2 includes a schematic block diagram of a system for detecting light illuminance as a function of distance.

FIG. 2 includes a schematic block diagram of a system for detecting light illuminance as a function of distance. Referring to FIG. 2, system 70 includes a flat surface light source 74, which can be, for example, an A32700799 (136 mm×136 mm) light source, manufactured and sold by Chroma Ate Inc. (66, Hwa-ya 1st Rd., Hwa-Ya Technology Park, Kuei-Shan Hsiang, Taoyuan Hsien 333, Taiwan). Light source 74 can be mounted on a movable, controllable X-Y table 72 to ensure accurate control of Distance between light source 74 and sensor 76. According to the present disclosure, a 120 mm×120 mm area of light source 74 is investigated. Light source 74 is used to illuminate sensor 76, which is coupled to an illuminance meter 78, which can be, for example, a Minolta Model T-10 Lux Meter, which measures illuminance. A computer 80 is coupled to meter 78, light source 74 and X-Y table 72 to control the performance of the test.

Figure 3:
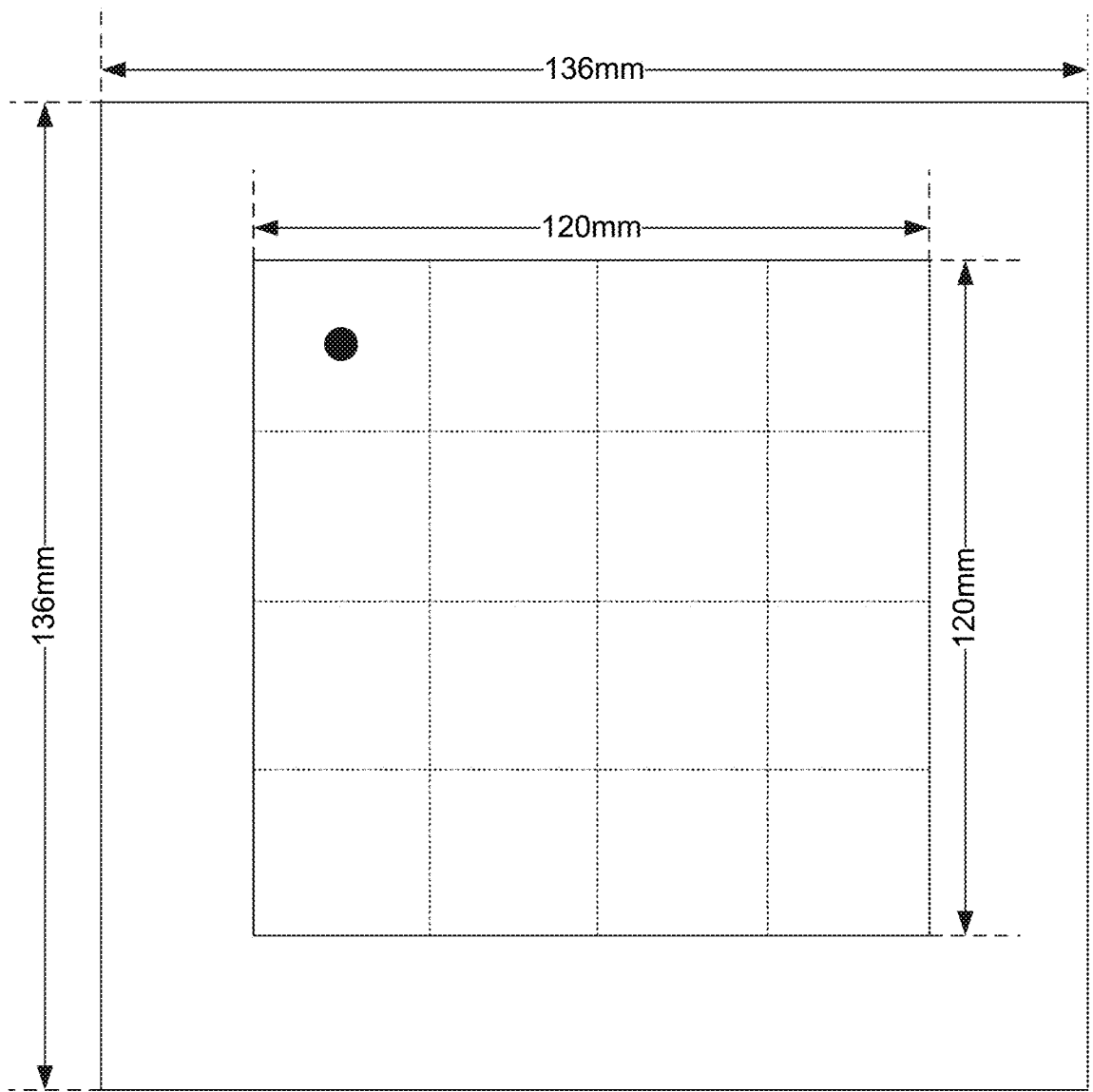
FIG. 3 includes a schematic diagram of a 120 mm×120 mm area of a light source tested during the experiment of FIG. 2.
Figure 4A:
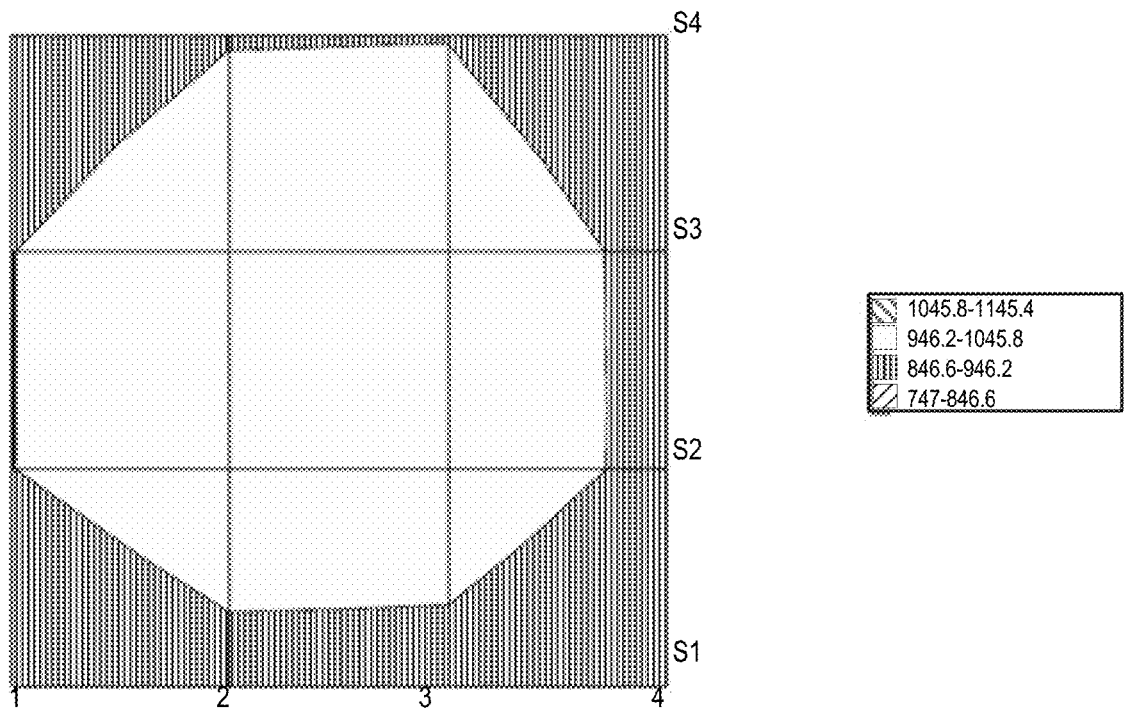
FIGS. 4A through 4F include contour line plots of the results of the distance-luminance experiment for the six combinations of distance and light source output, tested in the experiment of FIGS. 2 and 3.
Figure 4B:
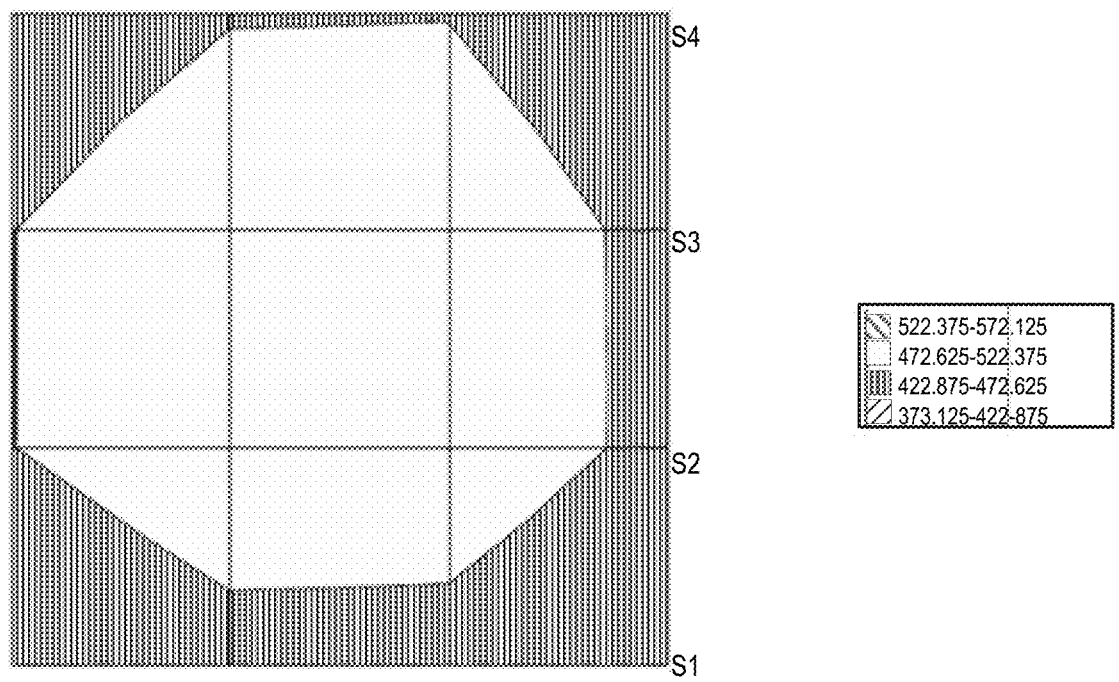
Figure 4C:
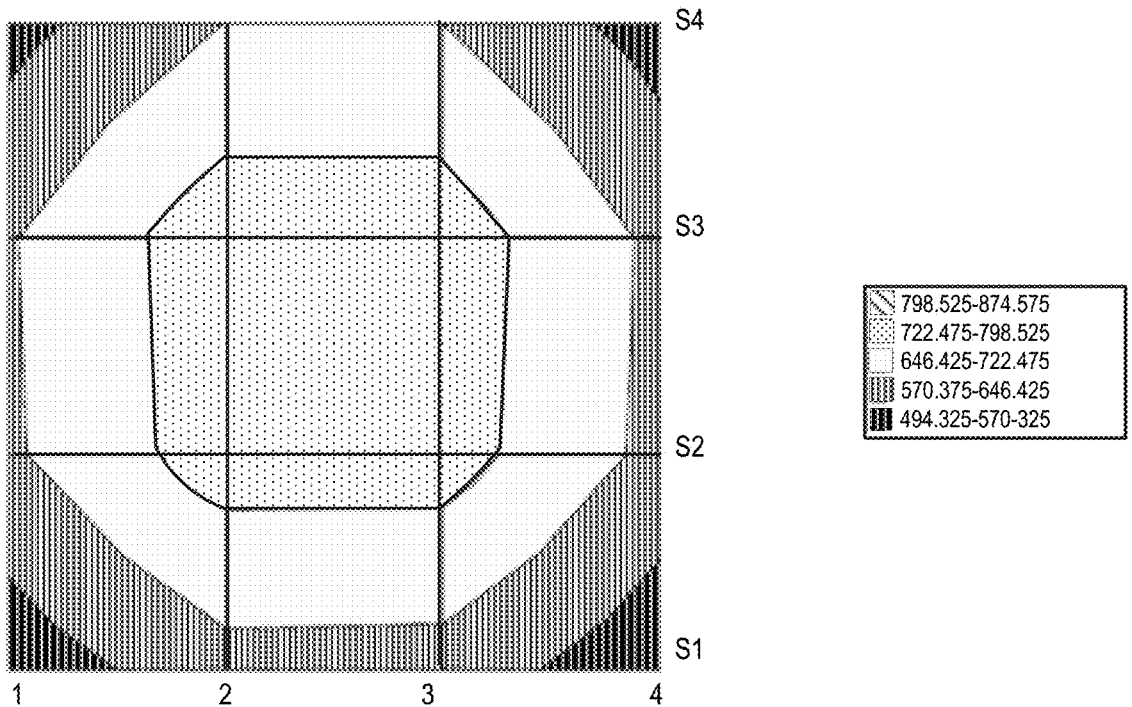
Figure 4D:
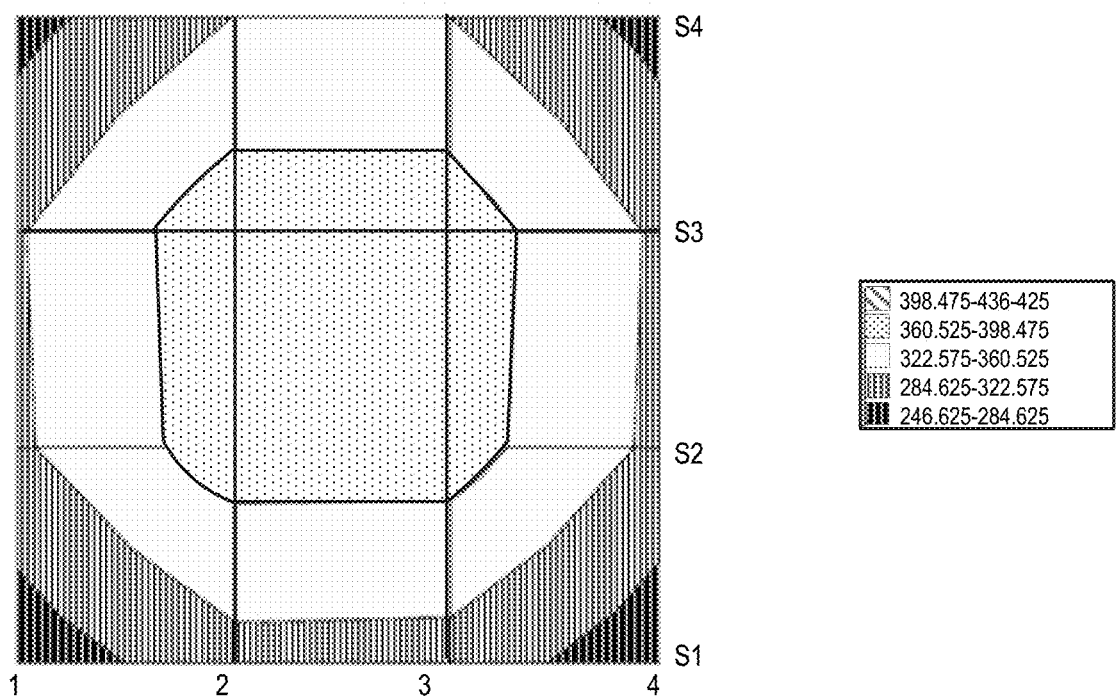
Figure 4E:
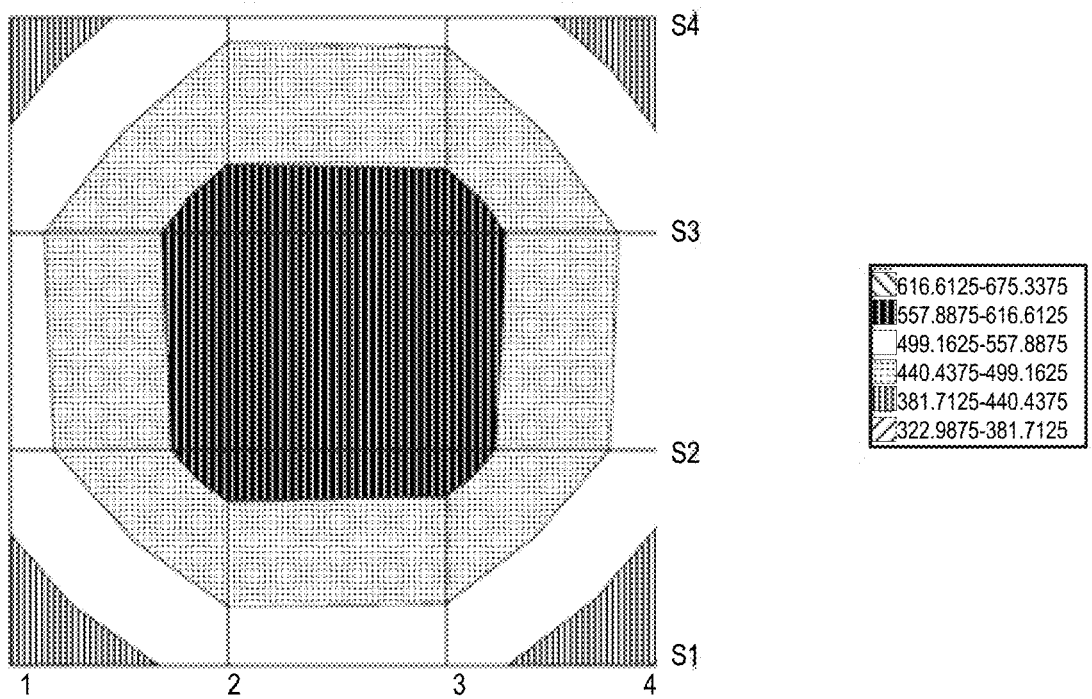
Figure 4F:
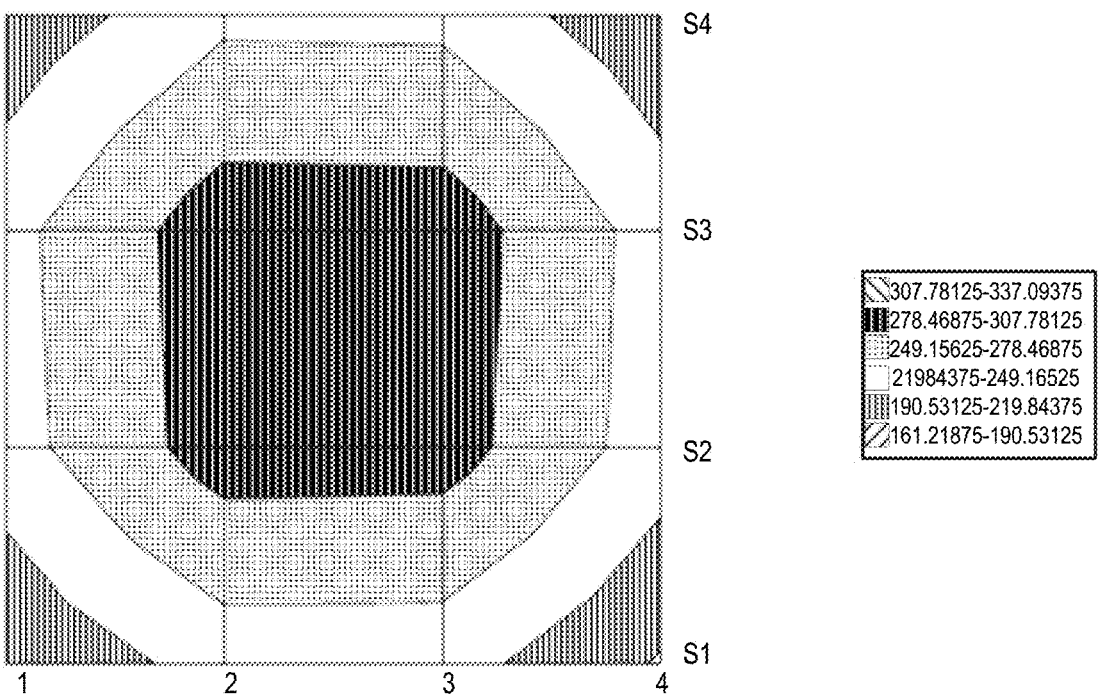

FIG. 3 includes a schematic diagram of a central 120 mm×120 mm light producing area of light source 74 that is tested during the experiment. Referring to FIG. 3, the central 120 mm×120 mm light producing area that is being tested is divided into sixteen smaller areas, with the center point of each smaller area being designated with a solid dot. For this experiment, distance from light source 74 to the sensor 76 is set at three levels, namely, 2 mm, 22 mm and 42 mm. The output illuminance of light source 74 is set at two levels, namely, 1,000 lux and 500 lux. Altogether, six combinations of distance and light source output are tested. FIGS. 4A through 4F include contour line plots of the results of the distance-luminance experiment for the six combinations of distance and light source output. Specifically, FIG. 4A is a contour line plot for a distance of 2 mm and light source output of 1000 lux; FIG. 4B is a contour line plot for a distance of 2 mm and light source output of 500 lux; FIG. 4C is a contour line plot for a distance of 22 mm and light source output of 1000 lux; FIG. 4D is a contour line plot for a distance of 22 mm and light source output of 500 lux; FIG. 4E is a contour line plot for a distance of 42 mm and light source output of 1000 lux; FIG. 4F is a contour line plot for a distance of 42 mm and light source output of 500 lux. The results are presented in the contour line (isoline) plots in FIGS. 4A through 4F to convey a visual representation of the distribution of illuminance. In FIGS. 4A through 4F, each contour line plot contains 16 vertices, which correspond to the 16 center points as shown in FIG. 3.

Referring to FIGS. 4A through 4F, it is readily apparent that uniformity is not significantly affected by light source output illuminance. Specifically, comparing FIGS. 4A to 4B, 4C to 4D and 4E to 4F, it can be seen that the change in light source illuminance output from 1000 to 500 lux has very little effect on uniformity. However, it can also readily be observed in FIGS. 4A through 4F that change in distance between the light source and the sensor does have a significant impact on the uniformity. Therefore, it can be concluded that illuminance uniformity decreases as the distance to the light source increases. Also, the rate of decrease of illuminance uniformity is more pronounced when the distance is relatively small. Specifically, in a current multi-site probe card working distance of approximately 25 mm, the illuminance is significantly non-uniform.

According to the present disclosure, the problem of a working distance required to accommodate components of the testing system presenting non-uniform illuminance is solved by positioning a control ring member between the light source and the probe card. In some exemplary embodiments, the control ring member includes sixteen (16) movable aperture elements, for example, ring units, which in some exemplary embodiments are arranged in a 4×4 matrix configuration. The 16 ring units correspond to the 16 probe card units 21 (see FIGS. 1A and 1B) for simultaneous optical testing of 16 dies on a wafer 12.

Figure 5A:
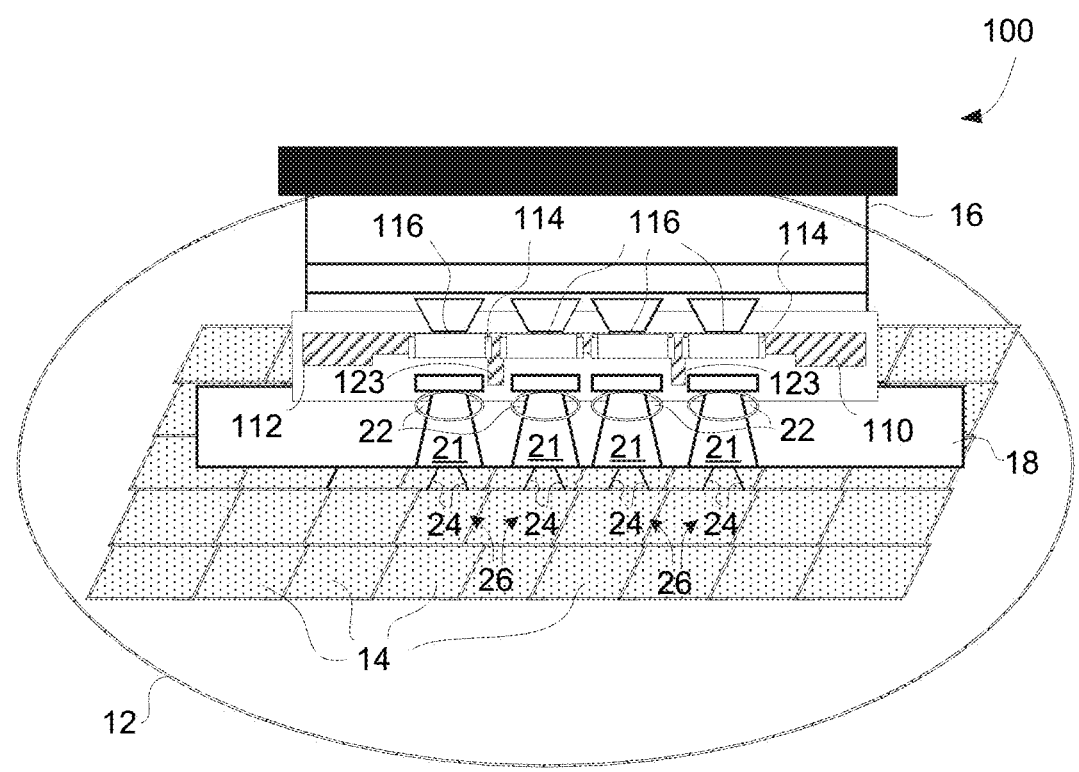
FIG. 5A includes a schematic perspective view of a system used to test a wafer on which a plurality of image sensors is formed, including a control ring member, according to some exemplary embodiments.
Figure 5B:
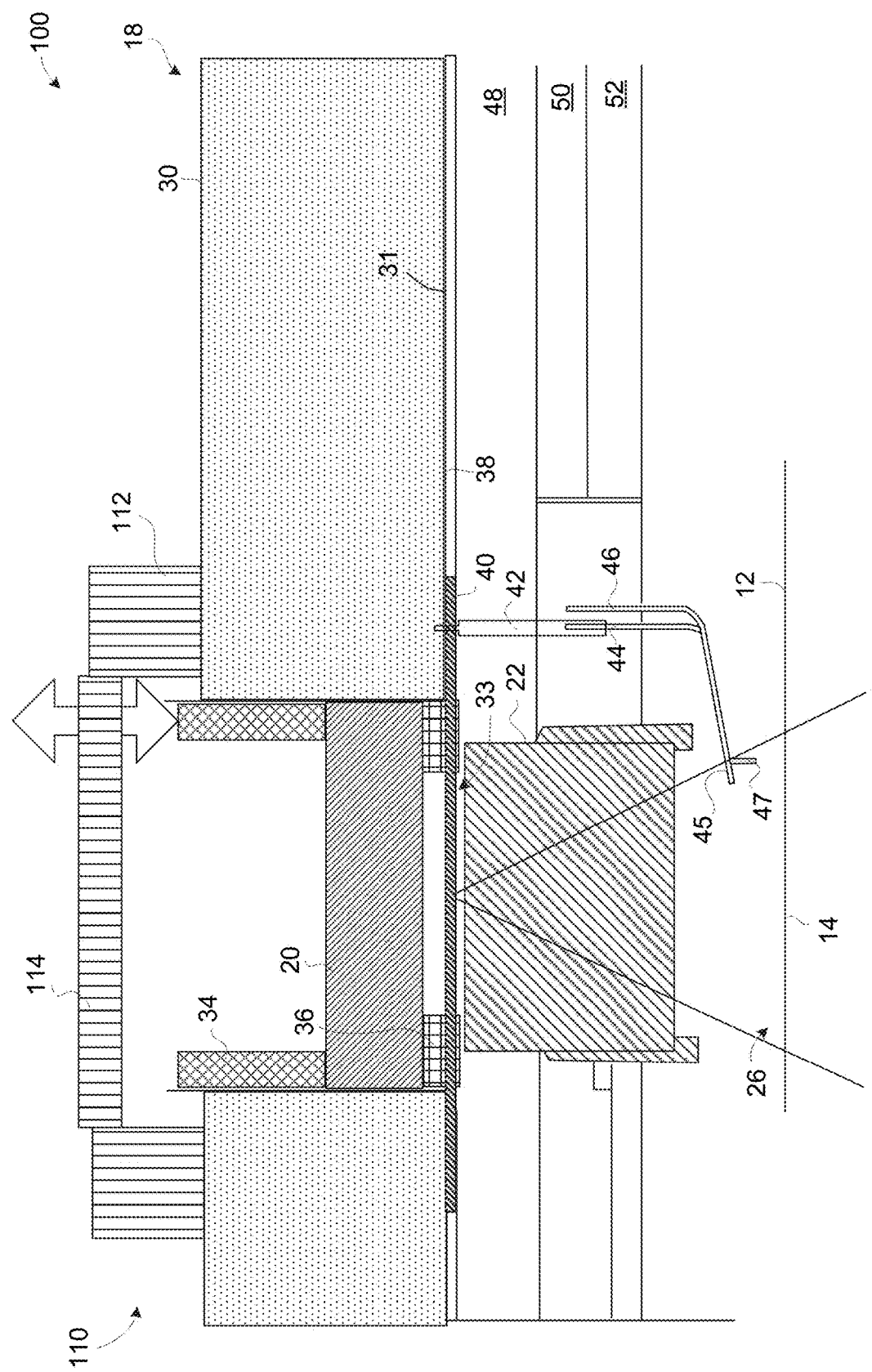
FIG. 5B includes a detailed schematic cross-sectional view of a portion of the system illustrated in FIG. 5A, including a control ring member, according to some exemplary embodiments.

FIG. 5A includes a schematic perspective view of a system 100 used to test a wafer on which a plurality of image sensors are formed, including a control ring member, according to some exemplary embodiments. FIG. 5B includes a detailed schematic cross-sectional view of a portion of system 100 illustrated in FIG. 5A, including a control ring member 110, according to some exemplary embodiments. Certain elements illustrated in FIGS. 5A and 5B are the same as elements illustrated and described above in connection with FIGS. 1A and 1B. Those like elements are identified by like reference numerals. Detailed description of those like elements will not be repeated.

Referring to FIGS. 5A and 5B, the control ring member 110 is placed on top of probe card 18. Control ring member 110 includes a ring holder 112 and at least one ring 114 held in ring holder 112. A plurality of supports 123 on the bottom side of ring holder 112 support ring control ring member 110 on probe card 18. An inner aperture 116 of each ring 114 is aligned with its corresponding diffuser 20 and lens 22 of its corresponding probe card unit 21, thereby forming a light path from light source 16 to the corresponding image sensor 14 below at the corresponding image sensor test site 26 that is being tested. Light from light source 16 above control ring member 110 passes through ring 114 before it reaches the corresponding diffuser 20 and lens 22, and eventually the corresponding image sensor test site 26 on wafer 12 below.

Each ring 114 is held in ring holder 112 such that it can be moved up or down along the light path that is defined through its aperture. This movement can be implemented, for example, by a mating thread on the outside diameter of ring 114 and inside diameter of a hole in ring holder 112 in which ring 114 is held. In this case, each ring 114 can be adjusted up or down by turning the ring, such as by a key or screwdriver or other such device mated with a notch or slot in the upper annular surface of ring 114. Alternatively, the inner annulus of ring 114 may be shaped as a polygon instead of a circle, so that a hex key, for example, such as an Allen wrench, may be used to rotate ring 114 to move it up or down. By moving ring 114 up or down, i.e., towards or away from light source 16, the amount of light flux that eventually reaches wafer 12 may be individually adjusted for each of the image sensor test sites 26. Therefore, although the illuminance from light source 16 is non-uniform initially, the light impinging on the wafer 12 at the 16 image sensor test sites 26 can be made uniform by individually adjusting each of the 16 rings 114.

Figure 5C:
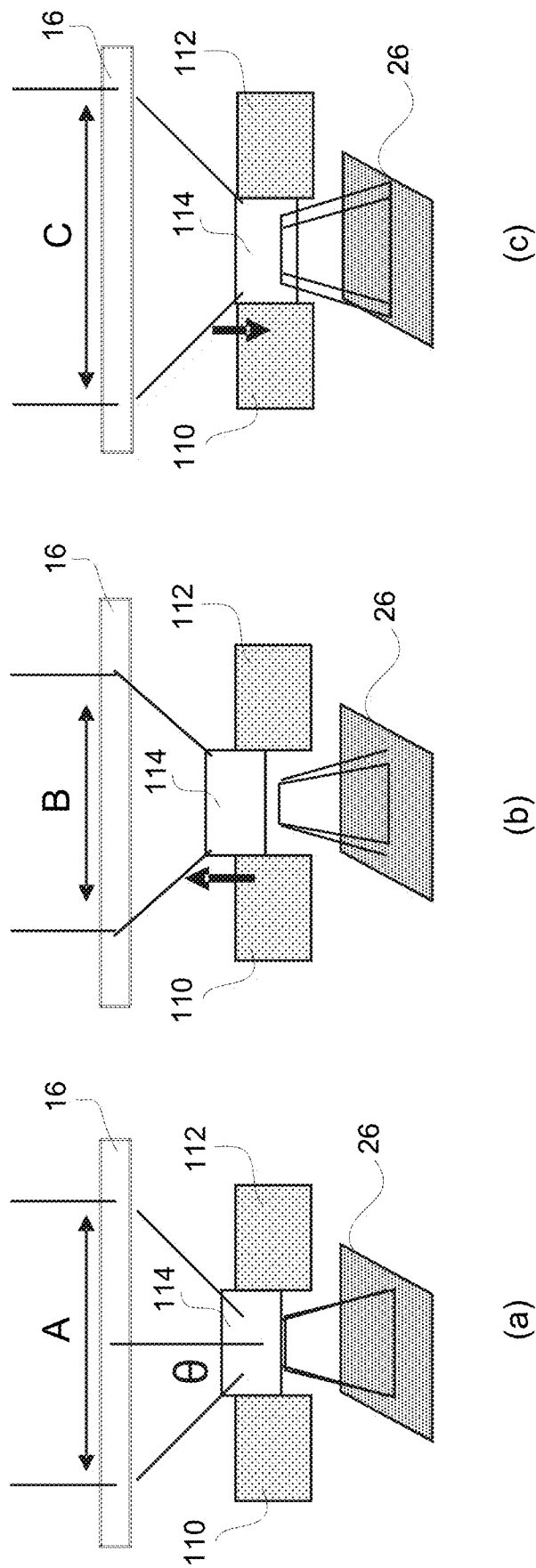
FIG. 5C includes schematic block diagrams of a test system according to some exemplary embodiments illustrating three different positions of a ring in three diagrams labeled (a), (b) and (c), respectively.
Figure 5D:
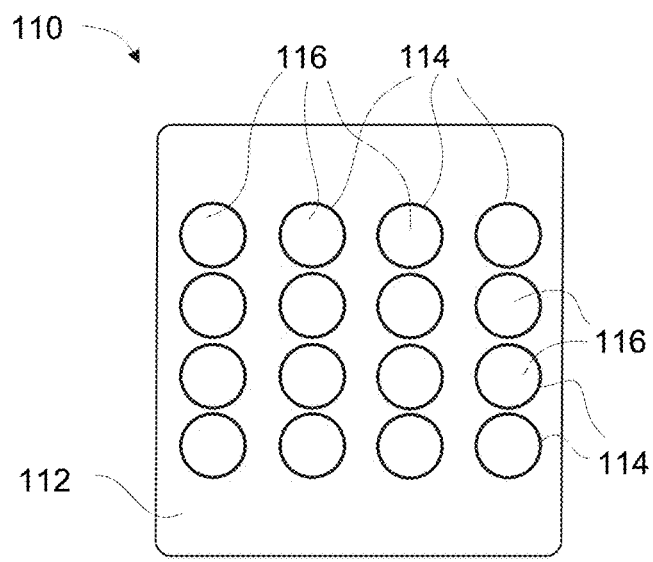
FIG. 5D includes a schematic plan view of a control ring member, according to some exemplary embodiments.
Figure 5E:
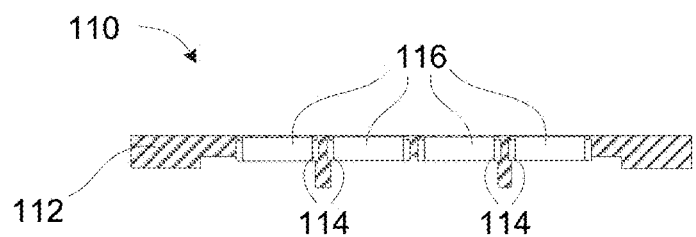
FIG. 5E includes a schematic side view of a control ring member, according to some exemplary embodiments.
Figure 5F:
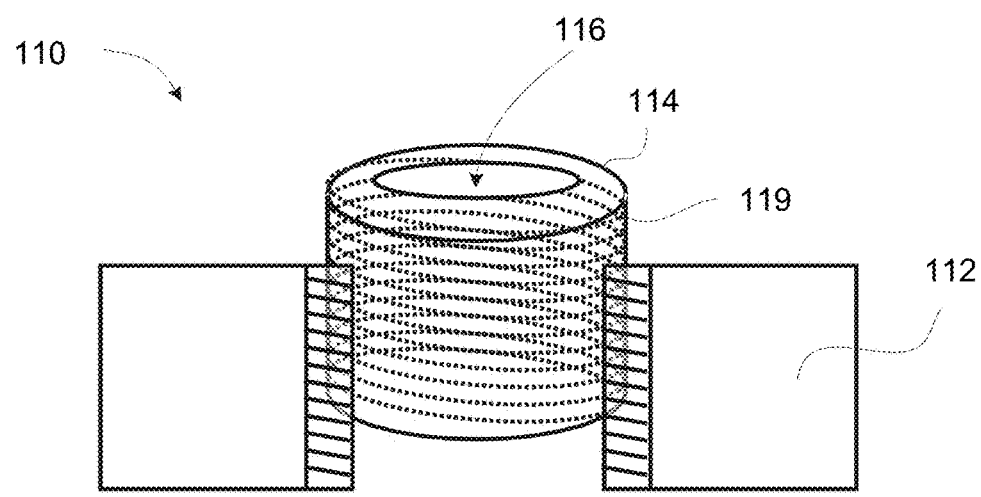
FIG. 5F includes a schematic partially perspective view of a control ring member, according to some exemplary embodiments.

FIG. 5C includes schematic block diagrams of test system 100 according to some exemplary embodiments, illustrating three different positions of ring 114 of the disclosure in three diagrams labeled (a), (b) and (c), respectively. In diagram (a), ring 114 is in a neutral or standard position; in diagram (b), ring 114 is in a raised position with respect to the neutral or standard position; and in diagram (c), ring 114 is in a lowered position with respect to the neutral or standard position. FIG. 5D includes a schematic plan view of control ring member 110, according to some exemplary embodiments. FIG. 5E includes a schematic side view of control ring member 110, according to some exemplary embodiments. FIG. 5F includes a schematic partial perspective view of control ring member 110, according to some exemplary embodiments.

Referring to FIGS. 5A through 5F, control ring member 110 is positioned above probe card 18 and below flat surface light source 16. The inside diameter (ID) of the annulus-shaped ring 114, i.e., the diameter of aperture 116 in ring 114, is given by Φ, the distance between the top of ring 114 and light source 16 is H, and the view angle is θ, as shown in FIG. 5C. Also, the illuminance density of light source 16 is designated as ρ, and is approximated to be a constant for illustrative purposes in this detailed description. Then, illuminance I(H, Φ) may be considered to be a function of H and Φ:

$$I(H, \Phi) = \frac{\pi}{4}\rho(\Phi + 2H \cdot \tan(\theta))^2$$

ID Φ provides a first variable used to tune illuminance I. A larger Φ allows for larger I. After Φ is selected, distance H provides a second variable which can be used to fine tune I. In some exemplary embodiments, a typical value of H is 4 to 8 mm; and a typical value of Φ is 6 to 10 mm. As an illustrative example, it is assumed that the view angle θ is 45 degrees.

For purposes of illustration, it is assumed that the first variable Φ is selected to be 8 mm. To further fine tune illuminance I, the second variable H is to be adjusted. According to some exemplary embodiments, H can first be set at 6 mm as a base level. If it is desired to decrease the illuminance, ring 114 can be moved up towards light source 16 such as by turning ring 114, such that H adjusted to 4.5 mm, for example. This will decrease the illuminance by about 44%. On the other hand, if it is desired to increase the illuminance, ring 114 can be moved downward away from light source 16, so that H is adjusted to 8.5 mm, for example. This will increase the illuminance by about 101%.

In some particular exemplary embodiments, the ID Φ of aperture 116 in ring 114 can be set at one of, for example, three possible values. In some particular exemplary embodiments, these three values are 6 mm, 8 mm and 10 mm. In some particular exemplary embodiments, the thickness of ring 114, i.e., outer diameter (OD) of ring 114 less inner diameter Φ, is typically approximately 2 mm. Therefore, in some particular exemplary embodiments, the OD of ring 114 is approximately 8 mm, 10 mm or 12 mm. In some exemplary embodiments, the height of ring 114 can be approximately 3 mm. In some exemplary embodiments, the thread 119 on ring 114 can be 0.5 mm per turn.

Figure 6A:
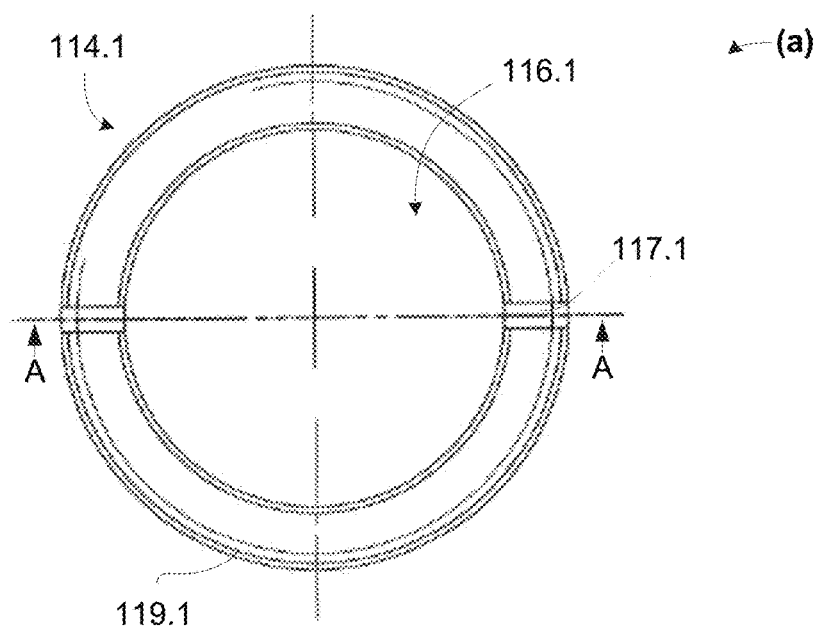
FIG. 6A includes a schematic top view (a) of a ring, a schematic cross-sectional view (b) of the ring 114.1 taken along line A-A of view (a), and a schematic perspective view (c) of the ring, according to some particular exemplary embodiments.
Figure 6A:
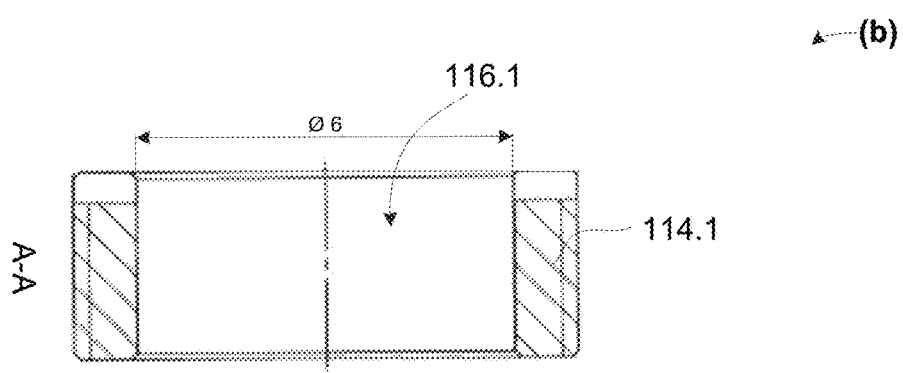
Figure 6A:
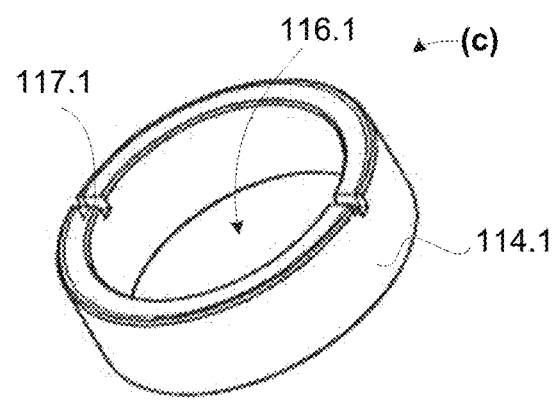
Figure 6B:
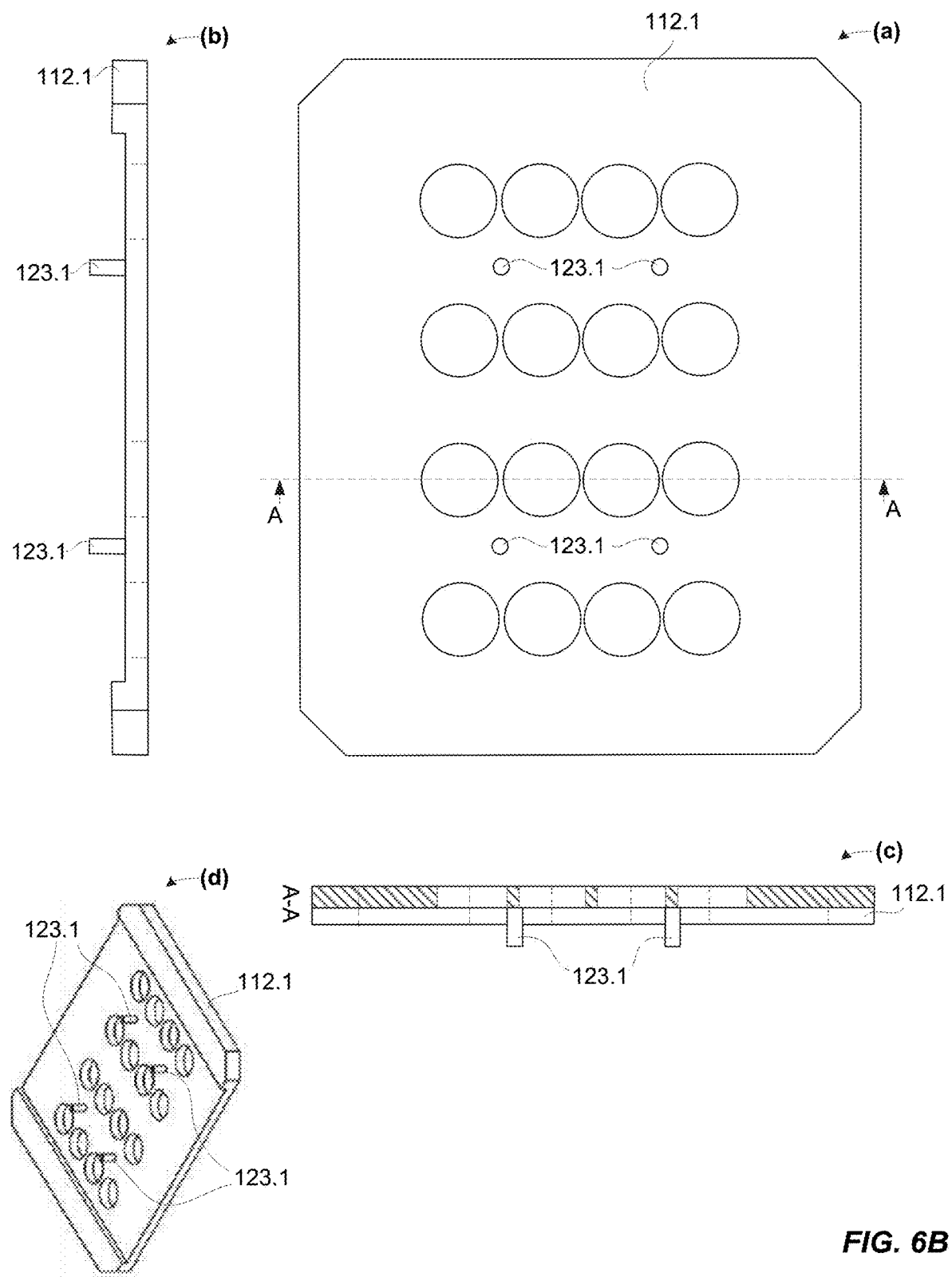
FIG. 6B includes a schematic top view (a) of a ring holder for the ring of FIG. 6A, a schematic side view (b) of the ring holder for the ring of FIG. 6A, a schematic cross-sectional view (c) of the ring holder for the ring of FIG. 6A taken along line A-A of view (a) of FIG. 6B, and a schematic perspective view (d) of the ring holder for the ring of FIG. 6A, according to some particular exemplary embodiments.
Figure 7A:
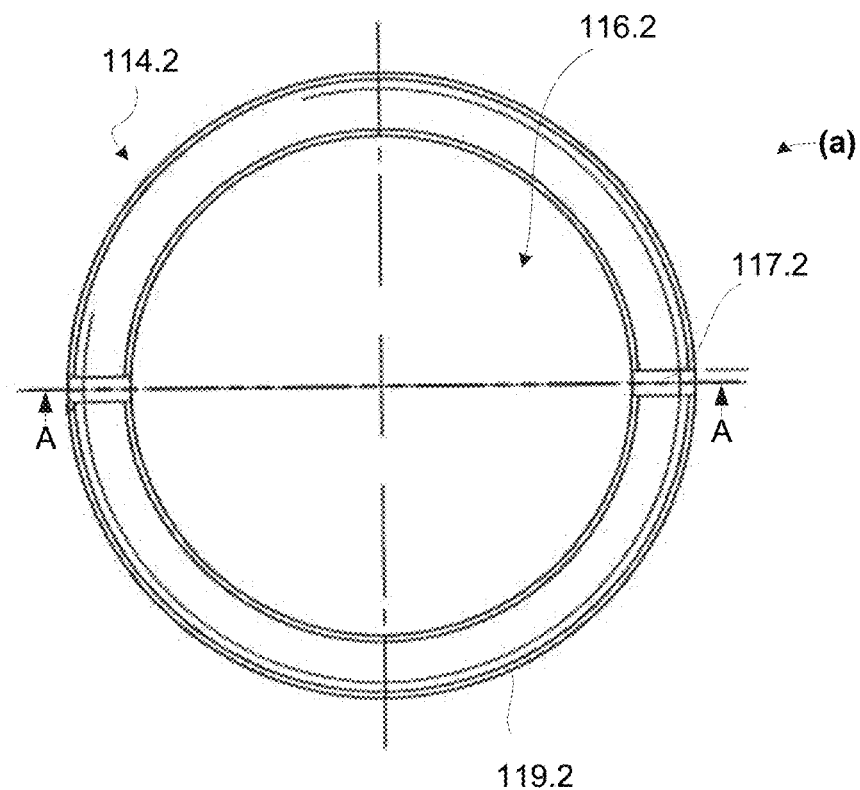
FIG. 7A includes a schematic top view (a) of a ring, a schematic cross-sectional view (b) of the ring taken along line A-A of view (a), and a schematic perspective view (c) of the ring, according to some particular exemplary embodiments.
Figure 7A:
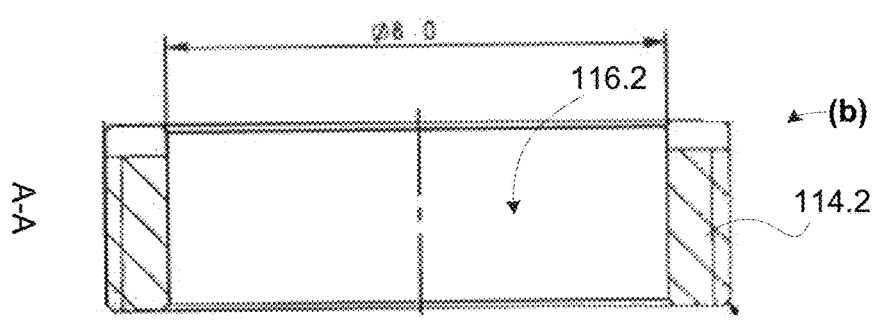
Figure 7A:
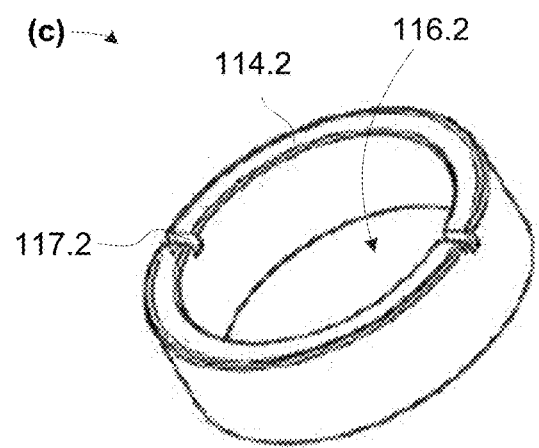
Figure 7B:
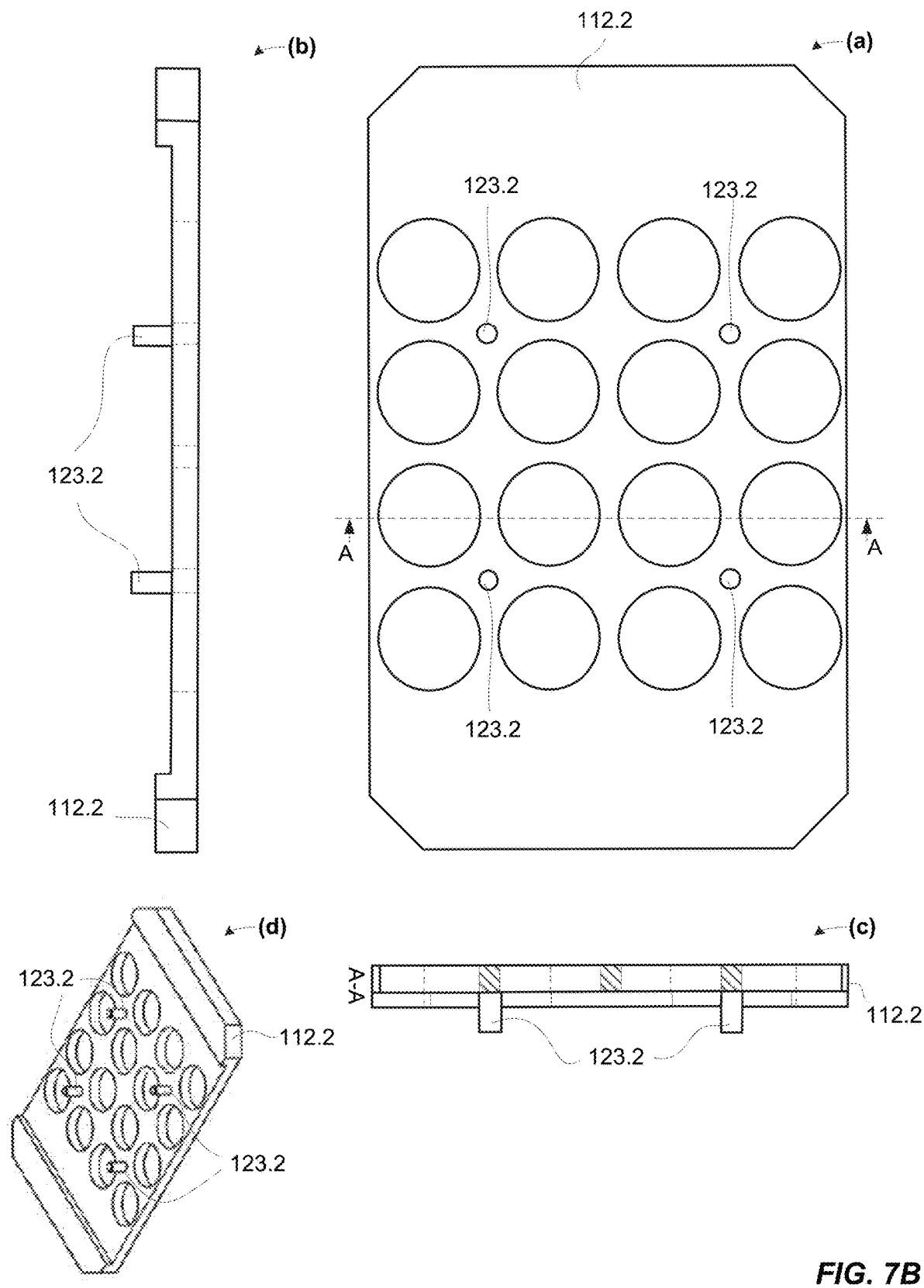
FIG. 7B includes a schematic top view (a) of a ring holder for the ring of FIG. 7A, a schematic side view (b) of the ring holder for the ring of FIG. 7A, a schematic cross-sectional view (c) of the ring holder for the ring of FIG. 7A taken along line A-A of view (a) of FIG. 7B, and a schematic perspective view (d) of the ring holder for the ring of FIG. 7A, according to some particular exemplary embodiments.
Figure 8A:
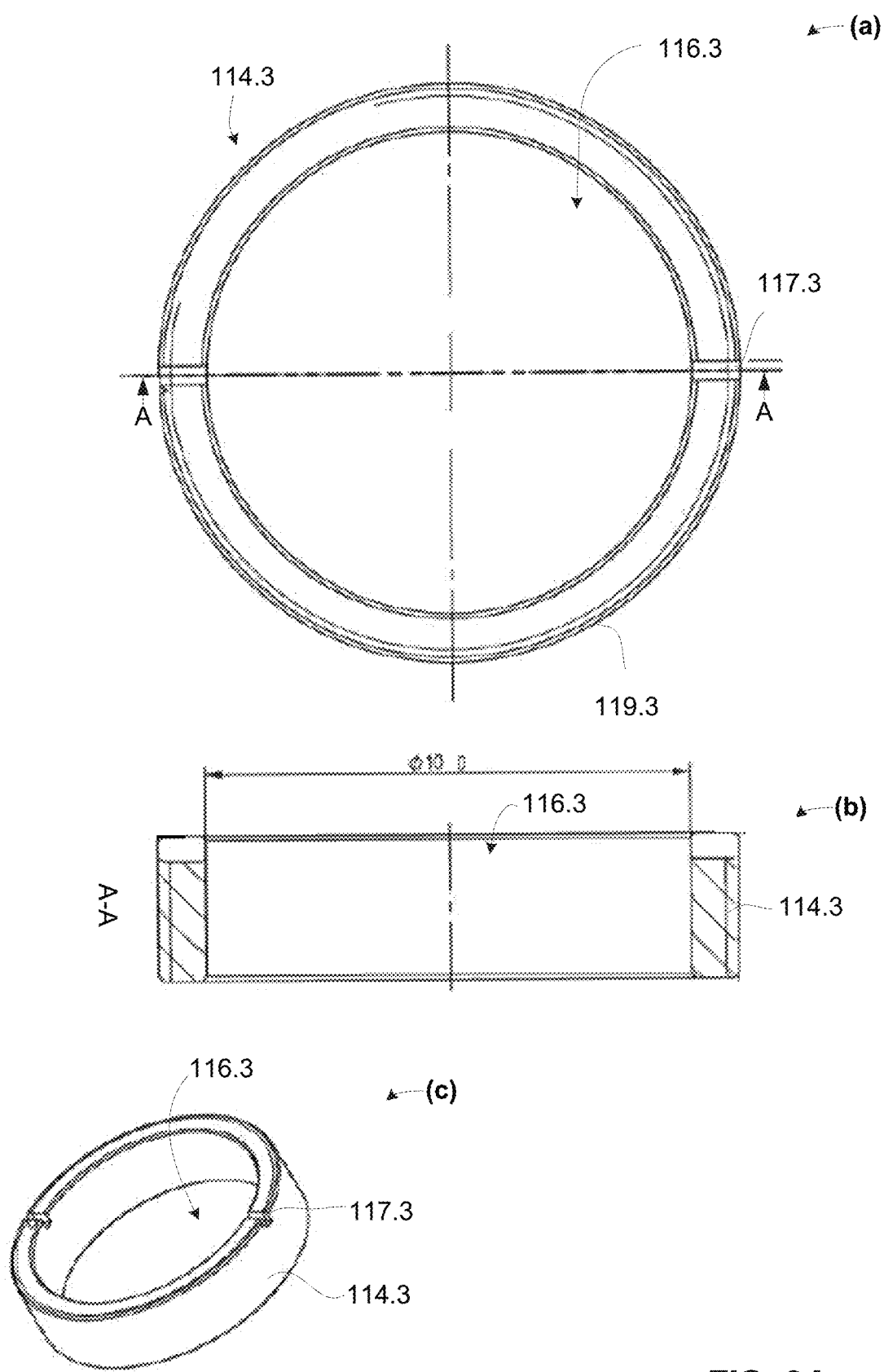
FIG. 8A includes a schematic top view (a) of a ring, a schematic cross-sectional view (b) of the ring taken along line A-A of view (a), and a schematic perspective view (c) of the ring, according to some particular exemplary embodiments.
Figure 8B:
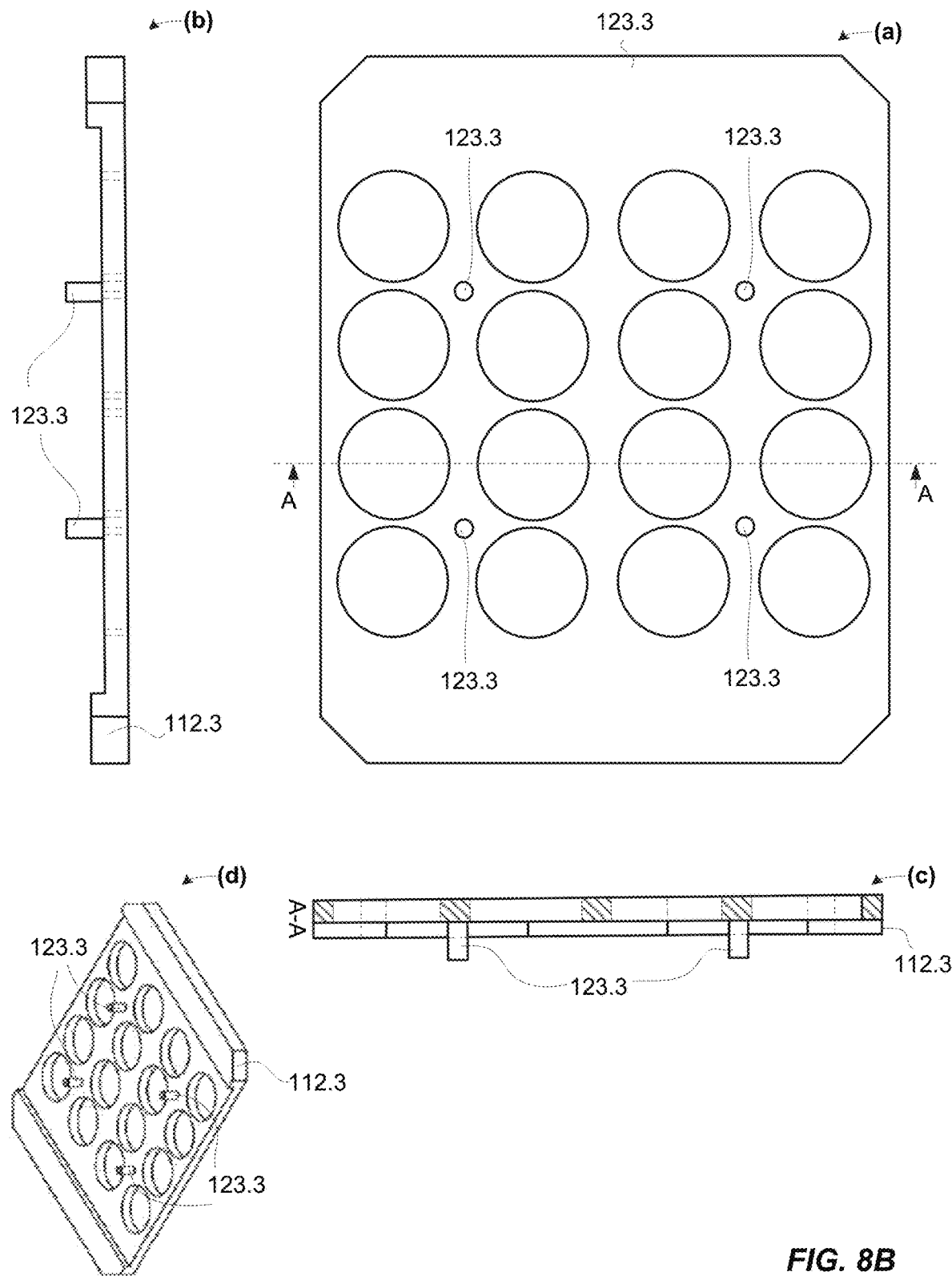
FIG. 8B includes a schematic top view (a) of a ring holder for the ring of FIG. 8A, a schematic side view (b) of the ring holder for the ring of FIG. 8A, a schematic cross-sectional view (c) of the ring holder for the ring of FIG. 8A taken along line A-A of view (a) of FIG. 8B, and a schematic perspective view (d) of the ring holder for the ring of FIG. 8A, according to some particular exemplary embodiments.

FIG. 6A includes a schematic top view (a) of ring 114.1, a schematic cross-sectional view (b) of ring 114.1 taken along line A-A of view (a), and a schematic perspective view (c) of ring 114.1, according to some particular exemplary embodiments. FIG. 6B includes a schematic top view (a) of ring holder 112.1 for ring 114.1 of FIG. 6A, a schematic side view (b) of ring holder 112.1 for ring 114 of FIG. 6A, a schematic cross-sectional view (c) of ring holder 112.1 taken along line A-A of view (a) of FIG. 6B for ring 114.1 of FIG. 6A, and a schematic perspective view (d) of ring holder 112.1 for ring 114.1 of FIG. 6A, according to some particular exemplary embodiments. FIG. 7A includes a schematic top view (a) of ring 114.2, a schematic cross-sectional view (b) of ring 114.2 taken along line A-A of view (a), and a schematic perspective view (c) of ring 114.2, according to some particular exemplary embodiments. FIG. 7B includes a schematic top view (a) of ring holder 112.2 for ring 114.2 of FIG. 7A, a schematic side view (b) of ring holder 112.2 for ring 114.2 of FIG. 7A, a schematic cross-sectional view (c) of ring holder 112.2 taken along line A-A of view (a) of FIG. 7B for ring 114.2 of FIG. 7A, and a schematic perspective view (d) of ring holder 112.2 for ring 114.2 of FIG. 7A, according to some particular exemplary embodiments. FIG. 8A includes a schematic top view (a) of ring 114.3, a schematic cross-sectional view (b) of ring 114.3 taken along line A-A of view (a), and a schematic perspective view (c) of ring 114.3, according to some particular exemplary embodiments. FIG. 8B includes a schematic top view (a) of ring holder 112.3 for ring 114.3 of FIG. 8A, a schematic side view (b) of ring holder 112.3 for ring 114.3 of FIG. 8A, a schematic cross-sectional view (c) of ring holder 112.3 taken along line A-A of view (a) of FIG. 8B for ring 114.3 of FIG. 8A, and a schematic perspective view (d) of ring holder 112.3 for ring 114.3 of FIG. 8A, according to some particular exemplary embodiments.

In the embodiments of FIGS. 6A and 6B, ring 114.1 has an ID of approximately 6 mm and an OD of approximately 8 mm. In the embodiments of FIGS. 7A and 7B, ring 114.2 has an ID of approximately 8 mm and an OD of approximately 10 mm. In the embodiments of FIGS. 8A and 8B, ring 114.3 has an ID of approximately 10 mm and an OD of approximately 12 mm.

Referring to FIGS. 6A and 6B, in some exemplary embodiments, the outer surface of ring 114.1 is formed with threads 119.1 for mating with threads in ring holder 112.1. Ring 114.1 includes slot or groove 117.1 for mating with a tool such as a screwdriver to permit rotation of ring 114.1 within ring holder 112.1 to adjust the height of ring 114.1 within ring holder 112.1 and, therefore, the distance between ring 114.1 and light source 16, such that illumination intensity at each image sensor test site 26 is adjustable. Ring holder 112.1 also includes a plurality of supports 123.1 for supporting ring holder 112.1 on probe card 18 (see FIG. 5A).

Referring to FIGS. 7A and 7B, in some exemplary embodiments, the outer surface of ring 114.2 is formed with threads 119.2 for mating with threads in ring holder 112.2. Ring 114.2 includes slot or groove 117.2 for mating with a tool such as a screwdriver to permit rotation of ring 114.2 within ring holder 112.2 to adjust the height of ring 114.2 within ring holder 112.2 and, therefore, the distance between ring 114.2 and light source 16, such that illumination intensity at each image sensor test site 26 is adjustable. Ring holder 112.2 also includes a plurality of supports 123.2 for supporting ring holder 112.2 on probe card 18 (see FIG. 5A).

Referring to FIGS. 8A and 8B, in some exemplary embodiments, the outer surface of ring 114.3 is formed with threads 119.3 for mating with threads in ring holder 112.3. Ring 114.3 includes slot or groove 117.3 for mating with a tool such as a screwdriver to permit rotation of ring 114.3 within ring holder 112.3 to adjust the height of ring 114.3 within ring holder 112.3 and, therefore, the distance between ring 114.3 and light source 16, such that illumination intensity at each image sensor test site 26 is adjustable. Ring holder 112.3 also includes a plurality of supports 123.3 for supporting ring holder 112.3 on probe card 18 (see FIG. 5A).

Figure 9:
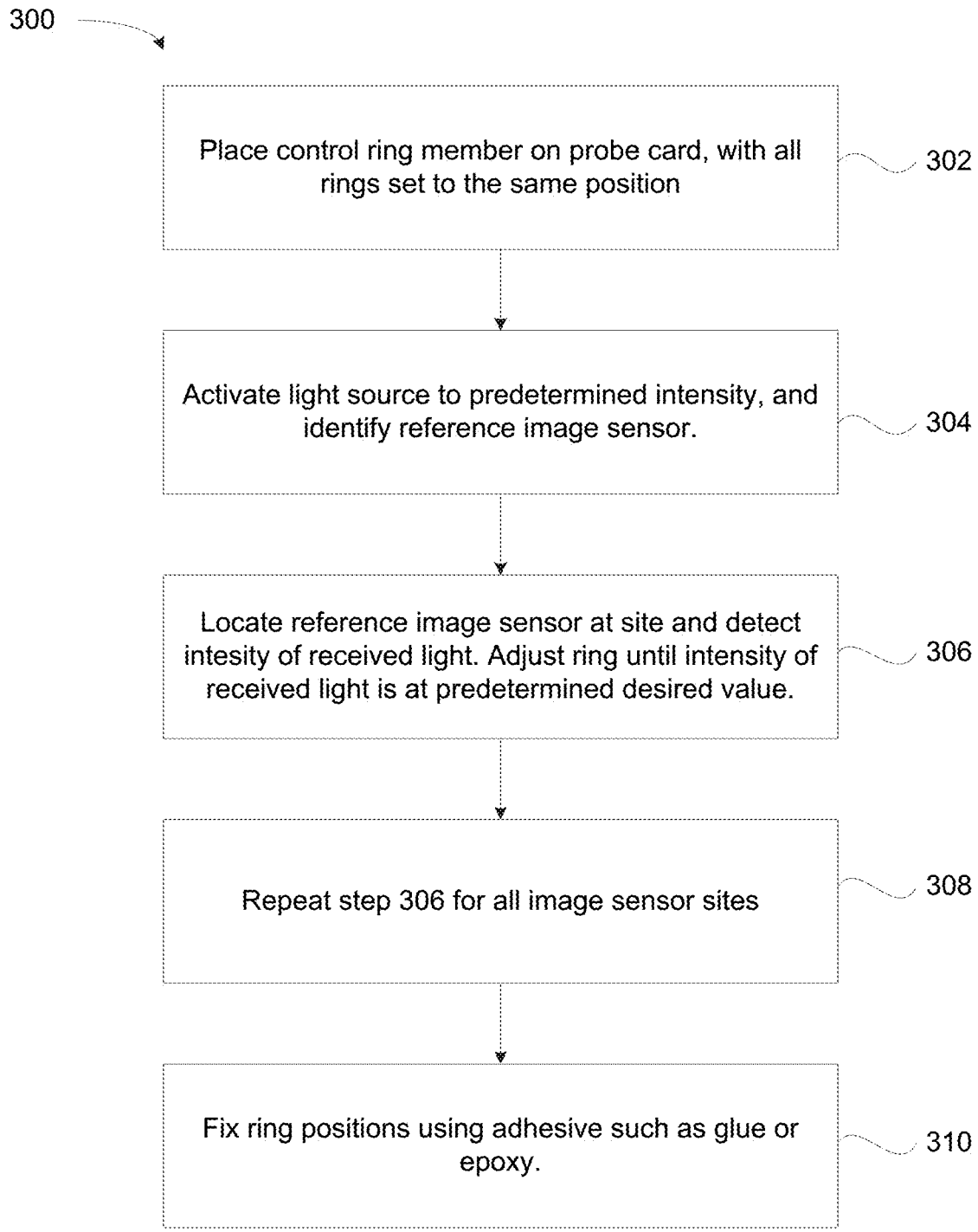
FIG. 9 includes a schematic logical flow diagram of steps in a process of adjusting rings in a control ring member such that test illumination received at a plurality of test sites is uniform, according to some exemplary embodiments.

FIG. 9 includes a schematic logical flow diagram of steps in a process of adjusting rings in a control ring member such that test illumination received at a plurality of test sites is uniform, according to some exemplary embodiments. According to this calibration process, a single reference test image sensor is used to measure the individual illuminace at each of the test sites, e.g., 16 test sites, individually. For this calibration, light source 16 is activated, and control ring member 110 is positioned over probe card 18. The reference image sensor is positioned at each test site, one at a time. At each test site, a determination is made as to whether an adjustment in illumination is desirable. If so, ring 114 at that site is adjusted appropriately, either up or down, to achieve the desired illumination intensity. This process continues until all of the test sites have been measured and appropriate ring adjustments have been made, such that the intensity of the illuimination at all 16 sites is uniform, and accurate simultaneous multi-site testing can be carried out.

Referring to FIG. 9, the process 300 begins in step 302 in which control ring member 110 is placed on top of probe card 18. In this initial setup, all of rings 114, e.g., all 16 of rings 114, are set to the same height. For example, all of rings 114 may be set to the neutral position illustrated in FIG. 5C (a). Next, in step 304, light source 16 is activated and set to a predetermined intensity level, and a reference image sensor chip or die is identified. Next, in step 306, the reference image sensor chip is located at one of the test sites to be used in subsequent testing. The intensity of the light detected by the reference image sensor is adjusted by adjusting the ring at the test site until the detected intensity is set to a desired predetermined value. Next, as shown in step 308, step 306 is repeated for all of the rings and respective image sensor test sites, such that the entire control ring member is calibrated. Next, in step 310, the calibration process is completed by fixing the rings in their adjusted positions such as by applying an adhesive such as glue or epoxy to the rings.

FIG. 10 includes a table which tabulates illumination test data for a plurality of test sites comparing a test system configuration in which the ring control member of the present disclosure is not used to provide uniform illumination at the plurality of test sites with a test system configuration in which the ring control member according to the present disclosure is used to provide uniform illumination at the plurality of test sites.

First, as a control experiment, a conventional light source with non-uniform illuminance was used to illuminate a wafer for optical testing without using the ring control member of the present disclosure. The results are listed on the left side of the table in FIG. 10. MeanR is the mean of red light signals. MeanG1 and MeanG2 are means of the two green light signals. MeanB is the mean of the blue light signals. The image sensor die reads light in red, green and blue components, using the Bayer pattern of color filters as commonly known in the art. The value areas are 8-bit digital numbers that are measured by the image sensor dies. Any of the red, green or blue light may be used in the operation of FIG. 9 to calibrate the rings for the 16 sites. In this example, the green light reading was used in the ring calibration. Therefore, the data in FIG. 10 show that the illuminance uniformity is the best with the green light component.

Next, the control ring member was inserted between the light source and the probe card, and the operational steps as set forth in FIG. 9 were carried out to adjust each ring and calibrate the control ring member. As a result, the illuminance of the light source became uniform of the 16 test sites. Optical testing was then carried out on the same wafer that was measured in the previous control experiment. The results are listed on the right side of the table in FIG. 10.

Referring to FIG. 10, 16 test sites were tested and results are tabulated accordingly. Maximum and minimum values, maximum and minimum ranges (Max-Min), as well as average and deviation ratios were computed and tabulated for each site. It is noted that the smaller the Max-Min range and deviation ratio, the more uniform the readings are among the 16 sites. FIG. 10 shows that by using the control ring member with its operating/calibration procedure as shown in FIG. 9, illuminance can be made uniform throughout the 16 sites.

As described above, each of a plurality of image sensor wafers can be optically tested with a probe card after it is manufactured. The probe card used for image sensor testing may include multiple probe card units, each probe card unit being designated for the optical testing of a single image sensor die.

Figure 11:
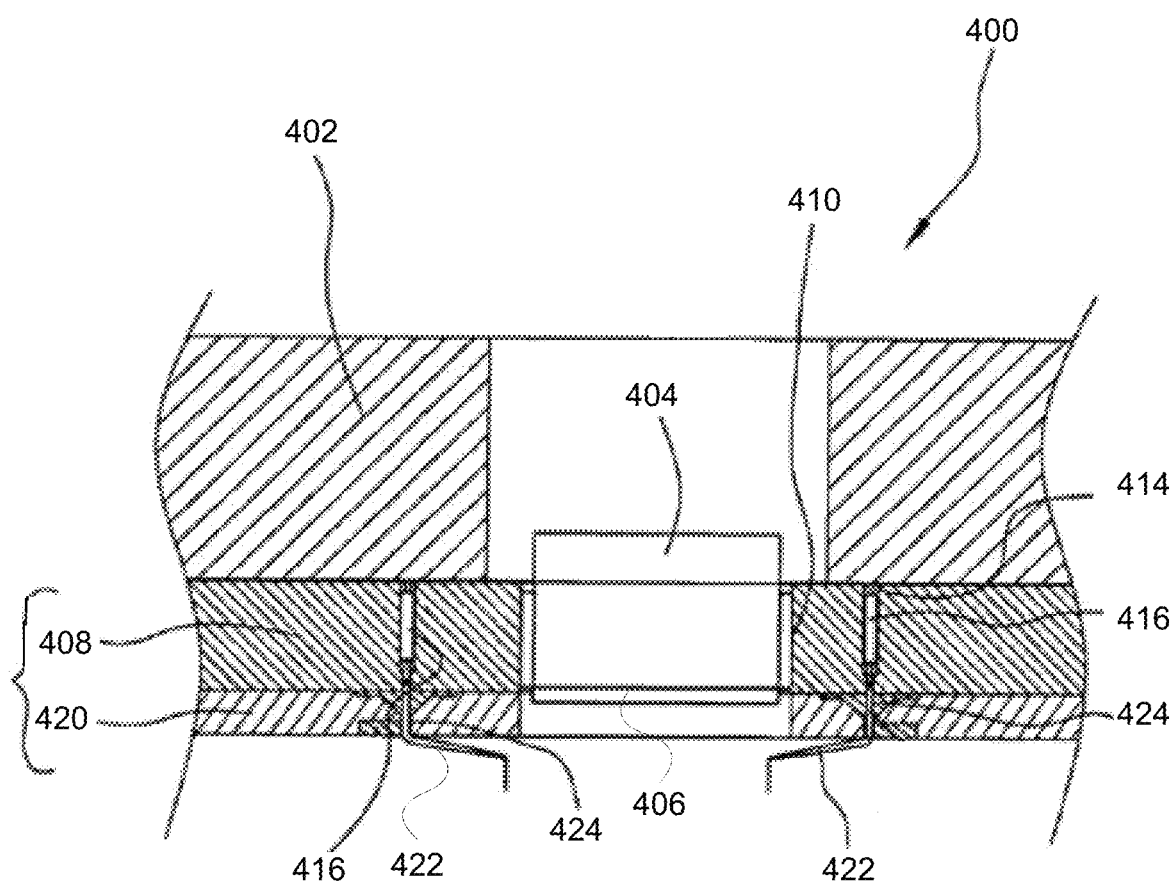
FIG. 11 includes a detailed schematic cross-sectional diagram illustrating a conventional probe card used to test a wafer on which a plurality of image sensors is formed.
Figure 12:
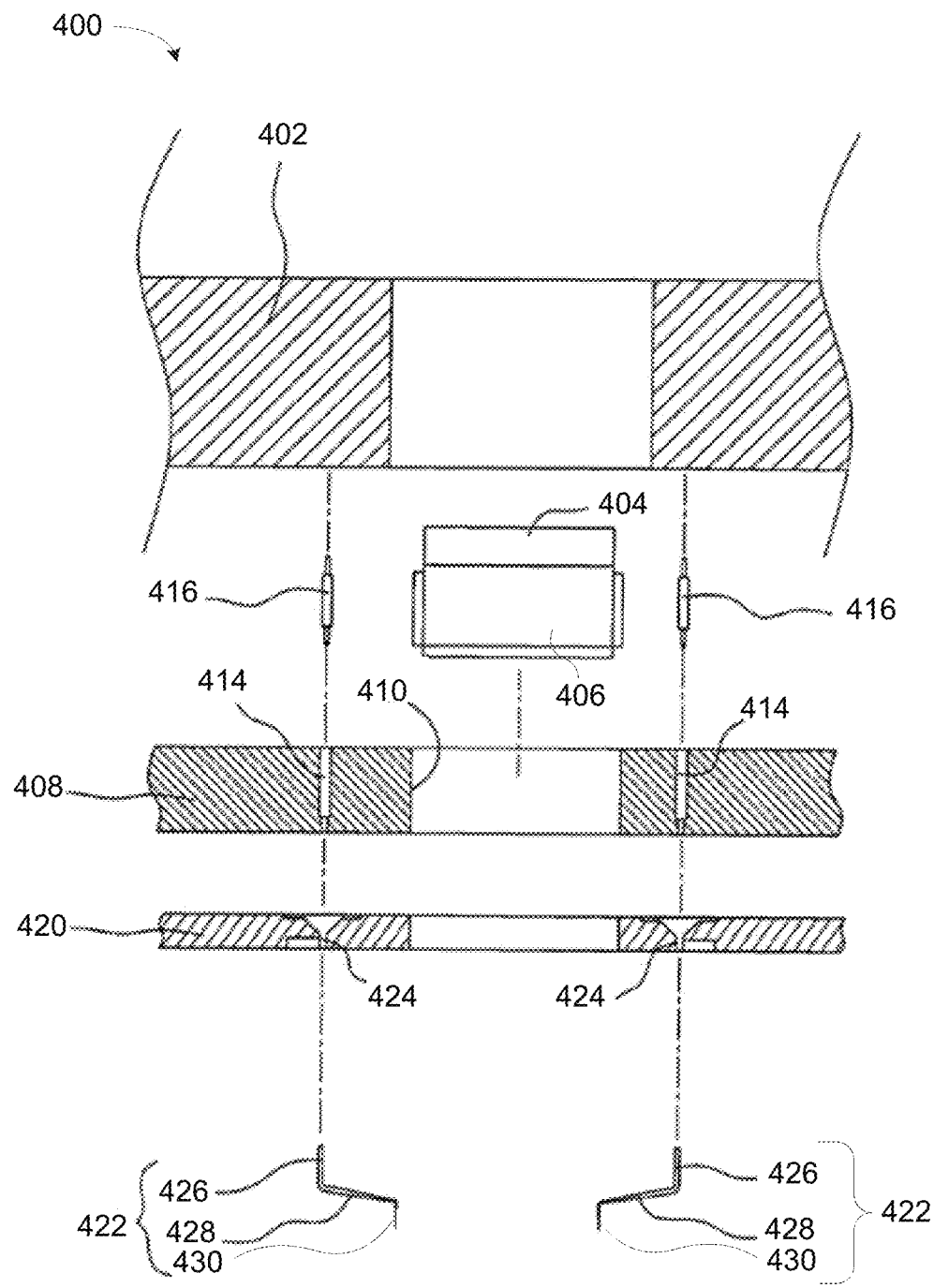
FIG. 12 includes a detailed schematic partially exploded cross-sectional diagram illustrating the probe card of FIG. 11.

FIG. 11 includes a detailed schematic cross-sectional diagram illustrating a conventional probe card 400 used to test a wafer on which a plurality of image sensors is formed. FIG. 12 includes a detailed schematic partially exploded cross-sectional diagram illustrating the probe card 400 of FIG. 11. Referring to FIGS. 11 and 12, probe card 400 includes a light diffuser 404, a lens 406 and a printed circuit board (PCB) 402. Light diffuser 404 and lens 406 are situated in probe card 400 as shown, and provide a light path for light from a light source above to reach the test die of the wafer below. PCB 402 can include a pattern of conductors on its lower surface. Probe card 400 also includes a plurality of pogo pins 416, which make electrical contact with the conductor pattern on the lower surface of PCB 402; a plurality of probe pins 422 that form electrical contact between a wafer die below and PCB 402, such that the conductor pattern on the lower surface of PCB 402 can be electrically connected to the wafer die; and a structural fixture portion including one or more plates 408, 420 with through holes 414, 424, respectively, in which pogo pins 416 and probe pins 422, respectively, are located.

Continuing to refer to FIGS. 11 and 12, pogo pins 416 can include one or two spring-loaded ends to ensure positive mechanical and electrical contact. Probe pins 422 are commonly referred to as "N-type" probe pins because of their approximate "N" shape. Each probe pin 422 includes a vertical portion 426, a cantilever portion 428 and a tip portion 430. A first spring-loaded end of pogo pin 416 makes contact with the conductor pattern on PCB 402, and a second spring-loaded end of pogo pin 416 makes contact with vertical portion 426 of probe pin 422. Tip portion of electrically conductive probe pin 422 can be connected to the wafer die, such that the conductor pattern on the lower surface of PCB 402 can be electrically connected to the wafer die via pogo pin 416 and probe pin 422.

The structural fixture portion of probe card 400 includes upper plate 408 having one or more through holes 414 in which pogo pins 416 are located, and lower plate 420 having one or more through holes 424 in which vertical portions 426 of probe pins 422 are located. Both upper plate 408 and lower plate 420 can be made of an electrically insulating material, for example, a ceramic material, to isolate the conductive pogo pins 416 and probe pins 422.

The conventional probe card illustrated in FIGS. 11 and 12 has several drawbacks. For example, the N-type probe pin 422, which is formed by bending a straight pin, must include vertical portion 426 and tip portion 430 in the same plane to ensure good contact with the wafer die during testing. This requirement adds complexity and time to the process of forming probe pin 422 and probe card 400. Also, the requirement for two plates 408 and 420, one for pogo pin 416 and one for probe pin 422, results in probe card 400 being relatively thick. As described above, this can degrade optical performance of probe card 400 due to a deep well effect. Also, during assembly of probe card 400, the process of aligning through holes 414 and 424 can be difficult and adds complexity and time to the assembly process.

According to some exemplary embodiments, these drawbacks of conventional probe cards are eliminated. In some exemplary embodiments, a probe pin includes only a cantilever portion and a tip portion for contacting the wafer. That is, in these embodiments, the probe pin does not include the vertical portion of the conventional probe pin used to make contact with the pogo pin. As a result, the electrical path between the PCB and the wafer is substantially shortened. Also, in these exemplary embodiments, the overall thickness of the probe card is substantially reduced. This allows for improved optical performance of the probe card. In addition, in some of these embodiments, the structural fixture portion includes only a single plate, instead of multiple plates, for supporting the pogo pin and the probe pin. As a result, the process of assembling/installing the probe card is substantially simplified by the elimination of the through hole alignment process required in the conventional system.

Figure 13:
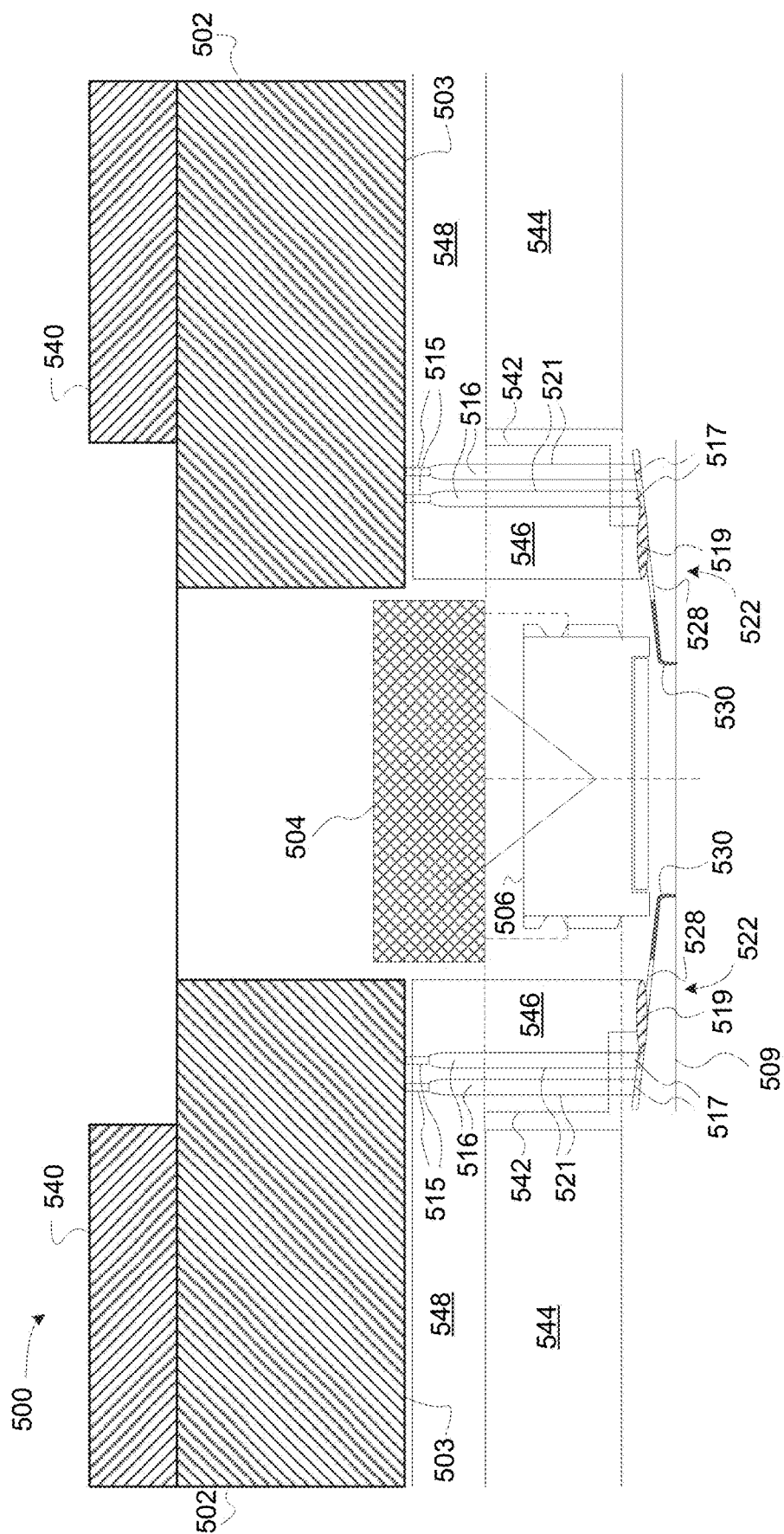
FIG. 13 includes a detailed schematic cross-sectional diagram illustrating a probe card used to test a wafer on which a plurality of image sensors is formed, according to some exemplary embodiments.

FIG. 13 includes a detailed schematic cross-sectional diagram illustrating a probe card 500 used to test a wafer on which a plurality of image sensors is formed, according to some exemplary embodiments. Referring to FIG. 13, probe card 500 includes PCB 502 having an opening in which optical diffuser 504 and lens 506 are disposed. A conductor pattern 503 is formed on a bottom surface of PCB 502 for making electrical connections to wafer 509 below probe card 500. A probe head 542 is disposed under PCB 502. Probe head 542 includes a body portion 546 and a "panhandle" portion 548. Holes 521 are formed, such as by drilling, through body portion 546 of probe head 542, and pogo pins 516 are disposed in through holes 521. Spring-loaded first ends 515 of pogo pins 516 make mechanical and electrical contact with conductor pattern 503 on the bottom surface of PCB 502.

Probe card 500 also includes probe pins 522, which are used to connect pogo pins 516, and, therefore, conductor pattern 503 on PCB 502, to wafer 509. In some exemplary embodiments, probe pins 522 include cantilever portions 528 and tip portions 530 for making contact with wafer 509, as shown. Cantilever portions 528 of probe pins 522 are in contact with second ends of pogo pins 516. In some exemplary embodiments, the second ends of pogo pins 516 include notches 517, which engage cantilever portions 528 of probe pins 522. Notches 517 provide a stable mechanical and electrical engagement between pogo pins 516 and probe pins 522. Probe pins 522 are fixedly attached to body portion 546 of probe head 542 by an adhesive, such as epoxy 519, as shown. In some exemplary embodiments, probe head 542 can be made of an electrically insulating material, for example, a ceramic material, to isolate the conductive pogo pins 516.

In some exemplary embodiments, probe card 500 also includes a spacer 544. In some embodiments, spacer 544 is disposed as shown in FIG. 13 under panhandle portion 548 of probe head 542 to provide mechanical support to the ceramic material of probe head 542. In some particular exemplary embodiments, spacer 544 can be made of a metallic material and, in some particular exemplary embodiments, is made of stainless steel. Spacer 544 is fixedly attached to probe head 542, such as by screws (not shown).

In some particular exemplary embodiments, body portion 546 of probe head 542 is approximately 3 mm thick, and panhandle portion 548 of probe head 542 is approximately 1 mm thick. Spacer 544 can be approximately 2 mm thick, such that the combination of probe head 542 and spacer 544 can be approximately 3 mm thick. In some exemplary embodiments, PCB 502 is approximately 3 mm thick. A stiffener frame 540, which can be made of a metallic material such as stainless steel, can be disposed over PCB 502 and provides structural support for PCB 502. In some exemplary embodiments, stiffener frame 540 can be approximately 10-20 mm thick (shown out of scale for clarity and ease of illustration).

Probe card 500 of FIG. 13 provides several advantages over conventional probe cards. For example, with probe pin 522 not including the vertical portion of conventional probe pins, the electrical path from the tip of probe pin 522 to PCB 502 is reduced, for example, by approximately 2 mm. The shorter electrical path results in better signal performance. Also, in the exemplary embodiments, only one structural fixture portion, namely, probe head 542, includes through holes for installation of pogo pins 516. Since probe pin 522 does not have a vertical portion, it does not require a through hole in the structural fixture portion. Therefore, with only one set of through holes, the time-consuming alignment of through holes, required in conventional probe cards, is eliminated. Also, the thickness of probe card 500, which includes the thickness of PCB 502, the thickness of panhandle portion 548 of probe head 542 and the thickness of spacer 544 is only approximately 6 mm, in some particular exemplary embodiments. In conventional devices, upper plate 408 and lower plate 420 have a thickness of approximately 7 mm; therefore, the total conventional probe card thickness, including PCB, is approximately 10 mm. This is because in the conventional device, both plates are made of ceramic, so they must be relatively thick to provide structural integrity. In the exemplary embodiments, stainless steel spacer 544 provides good structural support, such that probe card 500 may be relatively thin. The thinner probe card provides better optical performance, because less edge light is blocked from reaching lens 506, i.e., the deep well effect is reduced. The result is more uniform illumination of probe card 500.

In the embodiments of FIG. 13, through holes 521 in body portion 546 of probe head 542 are drilled before probe head 542 is attached to spacer 544. This is a precaution taken to avoid breakage of the brittle ceramic material of probe head 542 at its high-stress area, such as panhandle portion 548, which breakage might occur if probe head 542 were drilled after being attached to spacer 544. In these embodiments, since attachment to spacer 544 is carried out after through holes 521 are drilled, the position of through holes 521 may not be precisely controlled. As a result, assembly tolerances need to be met.

Figure 14:
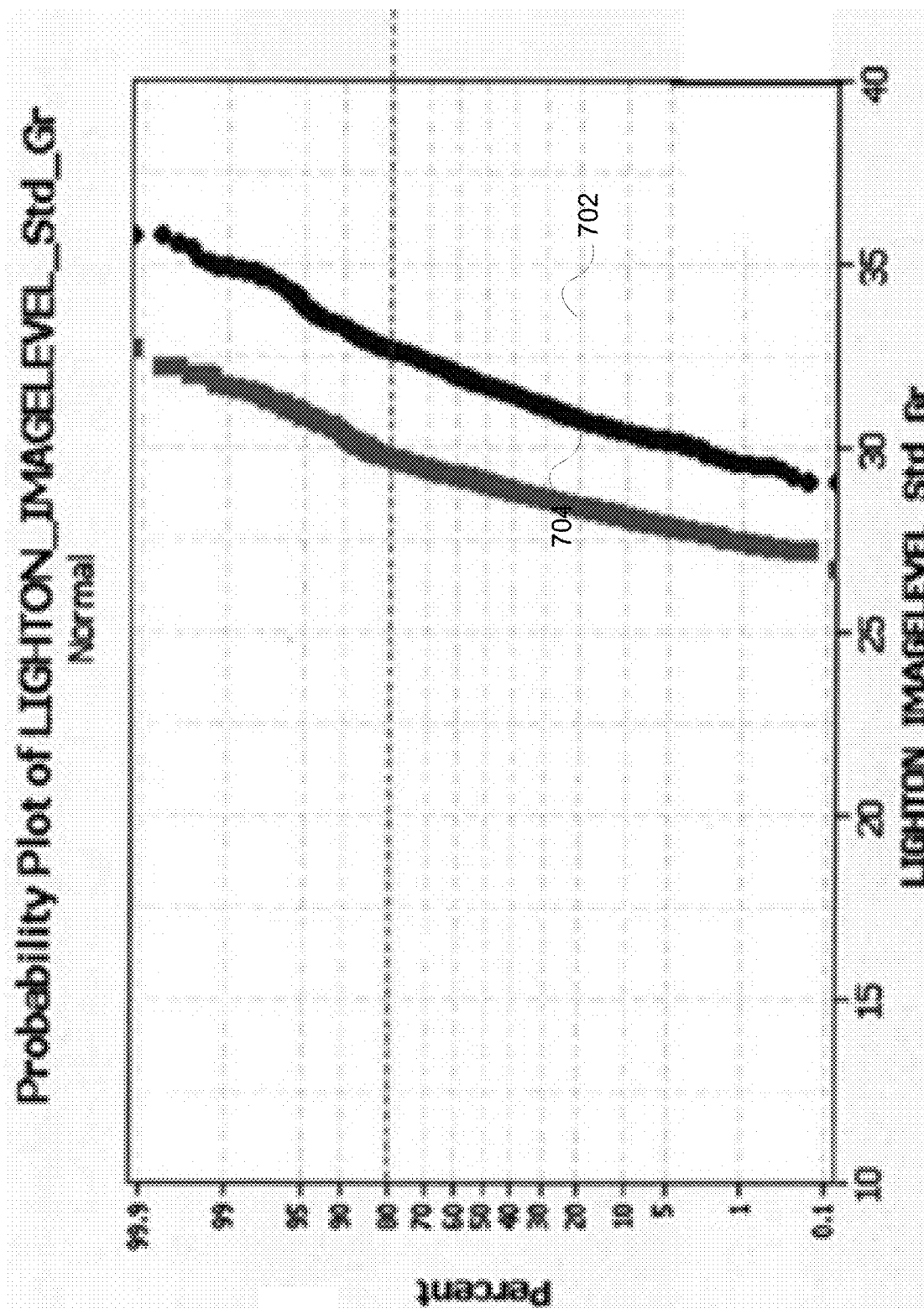
FIG. 14 includes a graph illustrating uniformity of light at a sensor illuminated through a conventional probe card and a probe card according to FIG. 13.

As noted above, probe card 500 illustrated in FIG. 13 provides more uniform illumination. FIG. 14 includes a graph illustrating uniformity of light at a sensor illuminated through a conventional probe card and a probe card according to FIG. 13. Referring to FIG. 14, the curve labeled 702 illustrates illumination using a conventional probe card, and the curve labeled 704 illustrates illumination using a probe card of the type described in detail above in connection with FIG. 13. In the curves 702 and 704 of FIG. 14, only the probe cards between the two curves are different. The other elements of the systems, such as the wafer, the light source and the test equipment, are the same for the two curves. The x-axis of the graph is the standard deviation of image level of a green signal from the sensor, referring to a typical sensor using the Bayer pattern color filter including one red, one blue and two green color filters. The y-axis is the accumulated percentage of light. The results illustrate that the probe card of the type described in connection with FIG. 13 has lower standard deviation, i.e., is more uniform, than the conventional probe card, due to less edge light being blocked from reaching the lens, resulting in reduced deep well effect.

Figure 15:
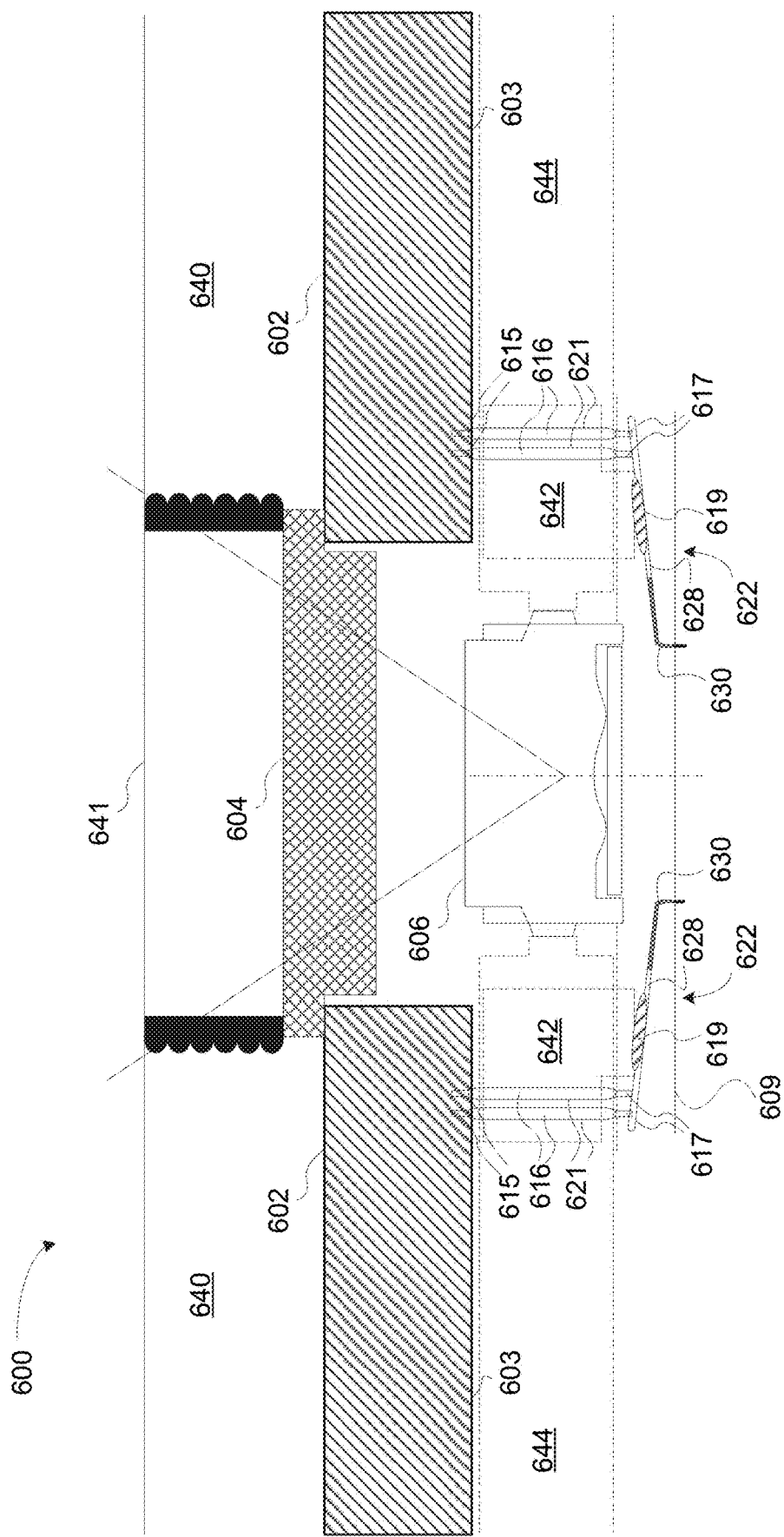
FIG. 15 includes a detailed schematic cross-sectional diagram illustrating a probe card used to test a wafer on which a plurality of image sensors is formed, according to some exemplary embodiments.

FIG. 15 includes a detailed schematic cross-sectional diagram illustrating a probe card 600 used to test a wafer on which a plurality of image sensors is formed, according to some exemplary embodiments. Referring to FIG. 15, it is noted that the embodiment illustrated therein includes a ring 641, of the type described in detail above, used to adjust uniformity of light at wafer 609, in accordance with the foregoing detailed description. It should be noted that any of the embodiments, including the embodiments illustrated in FIGS. 13 and 15, may include one or more of such rings 641 for adjusting illumination uniformity.

Referring to FIG. 15, probe card 600 includes PCB 602 having an opening in which optical diffuser 604 and lens 606 are disposed. A conductor pattern 603 is formed on a bottom surface of PCB 602 for making electrical connections to wafer 609 below probe card 600. A probe head 642 is disposed under PCB 602. In contrast with the embodiment of probe head 542 described in detail above in connection with FIG. 13, probe head 642 does not include a body portion and a panhandle portion. Instead, probe head 642 is a block configuration, which is attached horizontally to spacer 644. Holes 621 are formed, such as by drilling, through probe head 642 as shown, and pogo pins 616 are disposed in through holes 621. Spring-loaded first ends 615 of pogo pins 616 make mechanical and electrical contact with conductor pattern 603 on the bottom surface of PCB 602.

Probe card 600 also includes probe pins 622, which are used to connect pogo pins 616, and, therefore, conductor pattern 603 on PCB 602, to wafer 609. In some exemplary embodiments, probe pins 622 include cantilever portions 628 and tip portions 630 for making contact with wafer 609, as shown. Cantilever portions 628 of probe pins 622 are in contact with second ends of pogo pins 616. In some exemplary embodiments, the second ends of pogo pins 616 include spring-loaded pins 617, which engage cantilever portions 628 of probe pins 622. Second ends of pogo pins 616 could alternatively include notches 517, as described above in detail in connection with FIG. 13. Probe pins 622 are fixedly attached to probe head 642 by an adhesive, such as epoxy 619, as shown. In some exemplary embodiments, probe head 642 can be made of an electrically insulating material, for example, a ceramic material, to isolate the conductive pogo pins 616.

In some exemplary embodiments, probe card 600 also includes spacer 644. In some embodiments, spacer 644 is disposed as shown in FIG. 15, horizontally or laterally adjacent to probe head 642. In some particular exemplary embodiments, spacer 644 can be made of a metallic material and, in some particular exemplary embodiments, is made of stainless steel. Spacer 644 is fixedly attached to probe head 642, such as by epoxy.

In some particular exemplary embodiments, probe head 642 is approximately 3 mm thick. Also, in some exemplary embodiments, spacer 644 can be approximately 3 mm thick, such that the combination of probe head 642 and spacer 644 can be approximately 3 mm thick. In some exemplary embodiments, PCB 602 is approximately 3 mm thick. A stiffener frame 640, which can be made of a metallic material such as stainless steel, can be disposed over PCB 602 and provides structural support for PCB 602. In some exemplary embodiments, stiffener frame 640 can be approximately 10-20 mm thick (shown out of scale for clarity and ease of illustration).

Probe card 600 of FIG. 15 provides the same advantages over conventional probe cards as does probe card 500 of FIG. 13. These include reduced electrical path length, elimination of an alignment process for multiple vertical through holes, and improved optical performance due to reduced probe card thickness.

In contrast to the probe card embodiments of FIG. 13, in the embodiments of FIG. 15, through holes 621 can be drilled after probe head 642 is attached to spacer 644. As a result, the assembly tolerance of the embodiment of FIG. 13 is eliminated, resulting in a simpler assembly process which is less prone to error.

In the embodiments of FIG. 15, structural integrity of probe card 600 is also improved. This is due to the increased thickness of spacer 644. For example, in some embodiments, the spacer thickness can be 3 mm, instead of 2 mm, which improves the overall structural integrity of probe card 600.

Combinations of Features

Various features of the present disclosure have been described above in detail. The disclosure covers any and all combinations of any number of the features described herein, unless the description specifically excludes a combination of features. The following examples illustrate some of the combinations of features contemplated and disclosed herein in accordance with this disclosure.

In any of the embodiments described in detail and/or claimed herein, the feature of the light changed by moving one of the plurality of aperture elements can be illuminance of the light incident on the associated target.

In any of the embodiments described in detail and/or claimed herein, at least one of the plurality of aperture elements can be moved such that uniformity of illuminance of the light incident on the plurality of targets can be increased.

In any of the embodiments described in detail and/or claimed herein, each aperture can have a selectable inside diameter such that the illuminance at the associated target can be adjustable.

In any of the embodiments described in detail and/or claimed herein, if the inside diameter of the aperture is increased, the illuminance at the associated target can be increased, and, if the inside diameter of the aperture is decreased, the illuminance at the associated target can be decreased.

In any of the embodiments described in detail and/or claimed herein, each aperture element can be movable such that a distance between the aperture element and the light source can be adjustable, such that the illuminance at the associated target can be adjustable.

In any of the embodiments described in detail and/or claimed herein, if the distance between the aperture element and the light source is increased, the illuminance at the associated target can be increased, and, if the distance between the aperture element and the light source is decreased, the illuminance at the associated target can be decreased.

In any of the embodiments described in detail and/or claimed herein, the holder and aperture elements can be adapted to be calibrated to provide improved uniformity of illuminance at the plurality of targets by selecting a distance between each aperture element and the light source by selectively moving the aperture elements to adjust illuminance at a reference target element as it is temporarily individually associated with each aperture element.

In any of the embodiments described in detail and/or claimed herein, the plurality of targets can comprise a plurality of image sensor elements formed on a wafer.

In any of the embodiments described in detail and/or claimed herein, the holder and aperture elements can be adapted to be positioned between the light source and a probe card used in testing the image sensor elements formed on the wafer.

In any of the embodiments described in detail and/or claimed herein, the plurality of image sensor elements can be illuminated by the light source simultaneously such that the plurality of image sensor elements can be tested simultaneously.

In any of the embodiments described in detail and/or claimed herein, the plurality of aperture elements can be held within the holder by mating threads; and the plurality of aperture elements can be movable along their longitudinal axes by rotating the aperture elements about their longitudinal axes.

In any of the embodiments described in detail and/or claimed herein, a probe pin can include a cantilever portion and a tip portion, the cantilever portion being in contact with and electrically connected to a second end of a pogo pin and the tip portion being electrically connectable to a wafer to electrically connect the wafer to a conductor pattern on the PCB, the cantilever portion of the probe pin being fixedly attached to the probe head.

In any of the embodiments described in detail and/or claimed herein, the cantilever portion of the probe pin can be fixedly attached to the probe head by epoxy disposed between and in contact with the cantilever portion of the probe pin and the probe head.

In any of the embodiments described in detail and/or claimed herein, the electrically insulating material of the probe head can be a ceramic material.

In any of the embodiments described in detail and/or claimed herein, the probe card can further comprise a spacer in proximity to the probe head, the spacer mechanically reinforcing the probe head.

In any of the embodiments described in detail and/or claimed herein, the spacer can be made of a metallic material.

In any of the embodiments described in detail and/or claimed herein, the spacer can be made of stainless steel.

In any of the embodiments described in detail and/or claimed herein, the probe head can comprise a main body portion and a panhandle portion, the spacer being disposed under the panhandle portion. In these embodiments, the at least one hole can be formed through the probe head before the probe head is attached to the spacer.

In any of the embodiments described in detail and/or claimed herein, the probe head can be horizontally adjacent to and fixedly attached to an end of the spacer. In these embodiments, the at least one hole can be formed through the probe head after the probe head is attached to the spacer.

In any of the embodiments described in detail and/or claimed herein, a second end of the pogo pin can include a notch which receives the cantilever portion of the probe pin.

In any of the embodiments described in detail and/or claimed herein, the probe card can be mountable to a stiffener frame for mechanical reinforcement of the probe card.

In any of the embodiments described in detail and/or claimed herein, the probe card can further comprise a lens for focusing light passing through the probe card.

In any of the embodiments described in detail and/or claimed herein, the probe card can further comprise an optical diffuser for diffusing light passing through the probe card.

While the present disclosure has shown and described exemplary embodiments, it will be understood by those of ordinary skill in the art that various changes in form and details may be made therein without departing from the spirit and scope of the present disclosure, as defined by the following claims.

We claim:

1. A method of increasing uniformity of light incident on a plurality of targets, the method comprising:

locating a plurality of movable aperture elements between a light source and the targets, each aperture element defining an aperture through which the light, having been emitted from the light source, propagates from the light source to an associated one of the plurality of targets associated with the aperture element along a longitudinal axis of the aperture element; and for each of the plurality of movable aperture elements:

independently moving the aperture element, along its longitudinal axis to change both an illuminance of the light propagating through the aperture element and an intensity of the light incident on the target, of the plurality of targets, associated with the aperture element until the intensity equals a desired predetermined value.

2. The method of claim 1, wherein each aperture has a selectable inside diameter such that the intensity is adjustable.

3. The method of claim 1, wherein each aperture element is movable such that a distance between the aperture element and the light source is adjustable, such that the intensity is adjustable.

4. The method of claim 1, wherein the aperture elements are adapted to be calibrated to provide improved uniformity of illuminance at the plurality of targets by selecting a distance between each aperture element and the light source by selectively moving the aperture elements to adjust illuminance at a reference target element as it is temporarily individually associated with each aperture element.

5. The method of claim 1, wherein the plurality of targets comprises a plurality of image sensor elements formed on a wafer.

6. The method of claim 1, further comprising holding the plurality of aperture elements within a holder, the holder being adapted to be positioned between the light source and a probe card used in testing the image sensor elements formed on the wafer.

7. The method of claim 6, wherein each of the plurality of image sensor elements is illuminated by the light source simultaneously such that each of the plurality of image sensor elements can be tested simultaneously.

8. The method of claim 6, wherein:

each of the plurality of aperture elements is held within the holder by mating threads; and each of the plurality of aperture elements is movable along its longitudinal axes by rotating the aperture elements about its longitudinal axes.

9. The method of claim 1, in the step of locating, the light source being a flat surface light source.

10. The method of claim 1, independently moving comprising moving the aperture element and no other aperture elements of the plurality of aperture elements.

* * * * *